United States Patent
Sugiyama

(10) Patent No.: US 9,664,757 B2
(45) Date of Patent: May 30, 2017

(54) COIL DEVICE AND MAGNETIC RESONANCE IMAGING APPARATUS

(75) Inventor: Eiji Sugiyama, Takasaki (JP)

(73) Assignee: Hitachi Metals, Ltd., Tokyo (JP)

( * ) Notice: Subject to any disclaimer, the term of this patent is extended or adjusted under 35 U.S.C. 154(b) by 651 days.

(21) Appl. No.: 14/237,346

(22) PCT Filed: Jul. 31, 2012

(86) PCT No.: PCT/JP2012/069411
§ 371 (c)(1),
(2), (4) Date: Feb. 5, 2014

(87) PCT Pub. No.: WO2013/021855
PCT Pub. Date: Feb. 14, 2013

(65) Prior Publication Data
US 2014/0167762 A1    Jun. 19, 2014

(30) Foreign Application Priority Data
Aug. 9, 2011    (JP) .................................. 2011-174309

(51) Int. Cl.
*G01V 3/00* (2006.01)
*G01R 33/385* (2006.01)
*G01R 33/38* (2006.01)

(52) U.S. Cl.
CPC ....... *G01R 33/385* (2013.01); *G01R 33/3858* (2013.01); *G01R 33/3806* (2013.01)

(58) Field of Classification Search
CPC .............. G01R 33/385; G01R 33/3858; G01R 33/3806

(Continued)

(56) References Cited

U.S. PATENT DOCUMENTS 4,774,487 A    9/1988  Aubert
4,829,252 A *  5/1989  Kaufman ........... G01R 33/3806
                                                 324/309

(Continued)

FOREIGN PATENT DOCUMENTS

CN    87108118 A    6/1988
CN    1278422 A     1/2001

(Continued)

OTHER PUBLICATIONS

Communication enclosing Extended European Search Report dated Apr. 10, 2015, issued for European patent application No. 12822252.8.

*Primary Examiner* — Susan Lee
(74) *Attorney, Agent, or Firm* — Rudy J. Ng; Bret E. Field; Bozicevic, Field & Francis LLP

(57) ABSTRACT

A coil device (1) in which a first coil (2), a second coil (4) and a third coil (3), each having a flat plate shape, are stacked with one other, wherein the first coil has a clearance section, the third coil has a second clearance section, part or whole of a lead wire (44) drawn out from the inside to the peripheral portion of the second coil while striding over the second coil (4) as well as part or whole of a lead wires (37*a*, 37*b*) drawn out from the inside to the peripheral portion of the third coil (3) while striding over the third coil are accommodated in the clearance section, and part or whole of lead wires (27*a*, 26*b*) drawn out from the inside to the peripheral portion of the first coil (2) while striding over the first coil are accommodated in the second clearance section.

17 Claims, 19 Drawing Sheets

(58) Field of Classification Search
USPC .......................................................... 324/322
See application file for complete search history.

(56) References Cited

U.S. PATENT DOCUMENTS

| | | | | |
|---|---|---|---|---|
| 4,933,657 | A * | 6/1990 | Bessho | ..................... H01F 7/20 |
| | | | | 335/296 |
| 5,386,191 | A * | 1/1995 | McCarten | .......... G01R 33/3628 |
| | | | | 324/322 |
| 5,874,831 | A * | 2/1999 | Yi | ........................ G01R 33/385 |
| | | | | 324/322 |
| 6,249,121 | B1 * | 6/2001 | Boskamp | ......... G01R 33/34061 |
| | | | | 324/318 |
| 6,580,274 | B2 * | 6/2003 | Sato | ................... G01R 33/3657 |
| | | | | 324/322 |
| 6,870,453 | B2 * | 3/2005 | Schulz | ............ G01R 33/34046 |
| | | | | 335/216 |
| 7,138,801 | B2 * | 11/2006 | Yamamoto | ....... G01R 33/34053 |
| | | | | 324/322 |
| 2001/0039717 | A1 * | 11/2001 | Goto | .................... G01R 33/385 |
| | | | | 29/605 |
| 2003/0025502 | A1 | 2/2003 | Higuchi | |
| 2004/0085067 | A1 * | 5/2004 | Stocker | ................ G01R 33/385 |
| | | | | 324/318 |
| 2004/0227516 | A1 | 11/2004 | Endt | |
| 2005/0073312 | A1 * | 4/2005 | Heid | ................... G01R 33/385 |
| | | | | 324/322 |

FOREIGN PATENT DOCUMENTS

| | | |
|---|---|---|
| JP | 06-22923 A | 2/1994 |
| JP | 2004073288 A | 3/2004 |
| JP | 2004-255182 A | 9/2004 |
| JP | 2005185784 A | 7/2005 |
| JP | 2007-307034 A | 11/2007 |
| JP | 2008-093003 A | 4/2008 |

* cited by examiner

FIG. 4
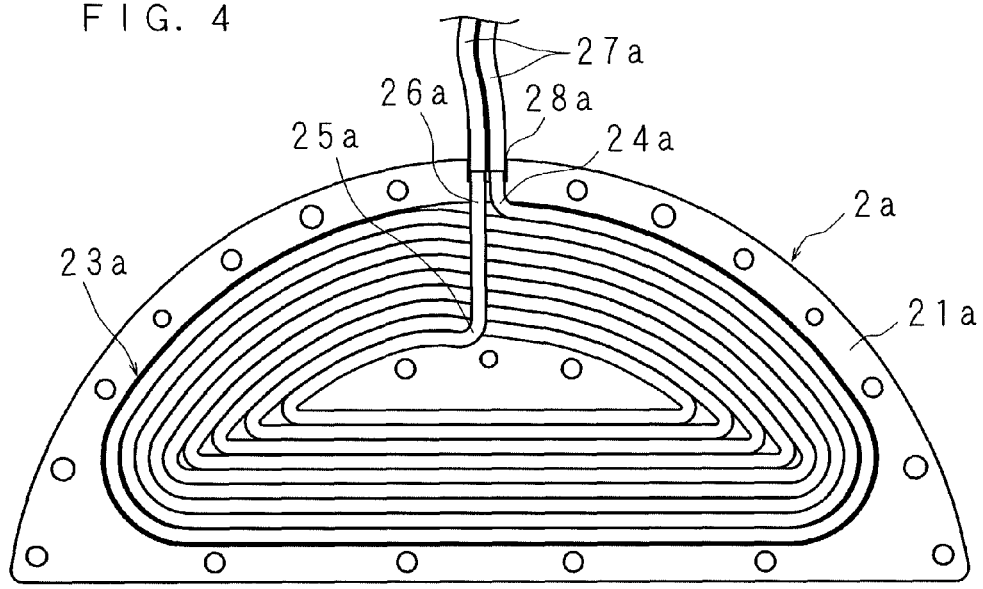
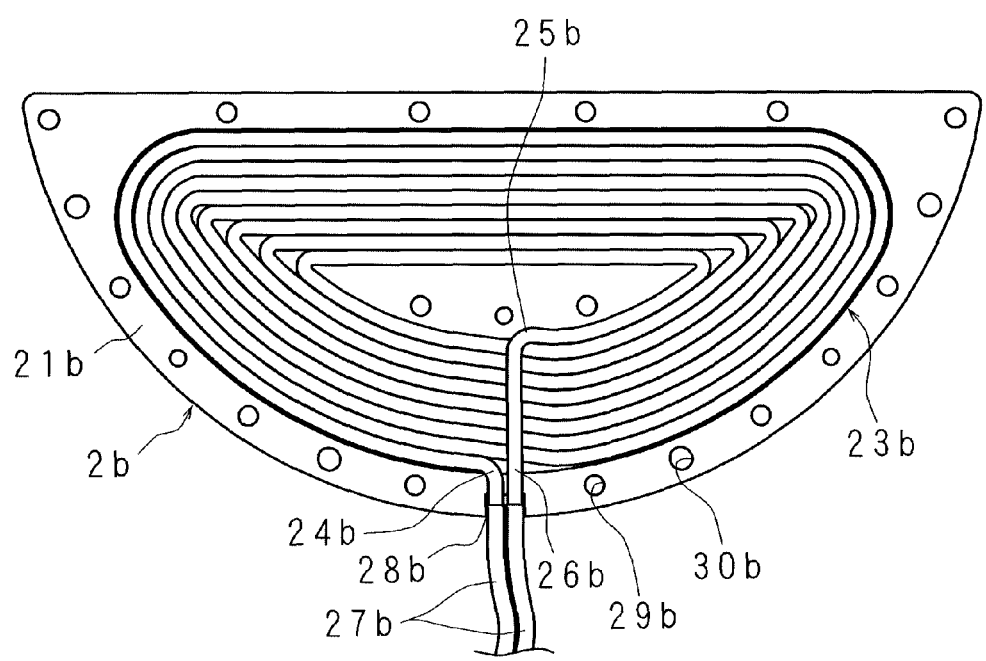

COIL DEVICE AND MAGNETIC RESONANCE IMAGING APPARATUS

CROSS-REFERENCE TO RELATED APPLICATIONS

This application is the national phase under 35 U.S.C. §371 of PCT International Application No. PCT/JP2012/069411 which has an International filing date of Jul. 31, 2012 and designated the United States of America.

TECHNICAL FIELD

The present invention relates to a coil device and a magnetic resonance imaging apparatus having the coil device as a gradient magnetic field coil.

BACKGROUND ART

A magnetic resonance imaging apparatus (hereafter referred to as "MRI apparatus") is an apparatus that uses a nuclear magnetic resonance (hereafter referred to as "NMR") phenomenon that occurs when a subject (living body) placed in a uniform static magnetic field is irradiated with high frequency pulses. The MRI apparatus measures the NMR signal generated by the nucleus spin of the atoms constituting the tissue of the subject. The MRI apparatus images the head, abdomen, limbs, etc. of the subject two-dimensionally or three-dimensionally using the measured NMR signal. During imaging, positional information, being different depending on a gradient magnetic field, is given to the NMR signal, and the NMR signal is measured as a digital signal. The measured digital signal is subjected to predetermined signal processing and a tomographic image is generated.

In such an MRI apparatus, the enhancement of the static magnetic field intensity thereof is underway to improve the spatial resolution and sensitivity of the apparatus.

The intensity of the static magnetic field is determined by various factors. One of the factors is the size of a magnetic gap. For the purpose of enhancing the static magnetic field intensity, it is necessary to reduce the magnetic gap formed by magnets and pole pieces opposed to each other with a gap interposed therebetween to the extremity depending on the size of the subject. In addition, members irrelevant to the generation of the static magnetic field but required to be disposed in the magnetic gap needs to be reduced in thickness.

The reason for this is that as the magnetic gap is smaller and the thicknesses of the members disposed in the magnetic gap are thinner, the distance between the subject and the magnets for generating the static magnetic field is reduced, and the intensity of the magnetic field applied to the subject is increased.

Gradient magnetic field coils are disposed in the magnetic gap. The gradient magnetic field coils are coils required to generate a gradient in the static magnetic field created by magnets. During imaging, the gradient magnetic field coils give positional information to the NMR signal generated from the subject, such as a human being or an animal.

As a type of the gradient magnetic field coil, a type in which a flat coil is stacked in layers is available. The gradient magnetic field coil is formed of three layers of coils for applying magnetic fields in the X-direction, Y-direction and Z-direction (static magnetic field direction) with respect to the direction of the static magnetic field.

Japanese Patent Application Laid-Open No. 2004-255182 discloses a flat coil that is used as a gradient magnetic field coil. In the case that the flat coil is stacked in layers to form a gradient magnetic field coil, a flat coil constituting one layer of the gradient magnetic field coil is provided with a groove in the surface portion of a bobbin having a flat plate shape. An electric wire, such as a copper wire, is embedded in the groove and wound in a spiral shape, thereby formed into a spiral electric wire. This spiral portion is referred to as a coil winding portion. Since the coil winding portion is formed into a flat shape, one end of the winding portion is close to the outer edge of the bobbin, but the other end of the winding portion is placed inside the coil winding.

Hence, the other lead wire (drawn-out wire) connected to the coil winding is required to stride over the coil winding from the inside of the coil winding when the lead wire is drawn out to the outside of the coil. The portion striding over the coil winding is herein referred to as a crossover wire. Since the crossover wire is a portion of the lead wire, the thickness of one layer of the flat coil is not just the thickness of the bobbin, but the thickness of the bobbin plus the thickness corresponding to the diameter of the crossover wire (see FIGS. 1a and 1b of Japanese Patent Application Laid-Open No. 2004-255182).

Since the gradient magnetic field coil is formed of three layers of coils, the thickness of the gradient magnetic field coil is the thickness of the three bobbins plus the thickness corresponding to three times the diameter of the crossover wire.

A prior art for reducing the thickness of a flat coil, such as a gradient magnetic field coil, is disclosed in Japanese Patent Application Laid-Open No. 2007-307034. More specifically, a conductive wire is disposed in a groove formed in a mold member in which the groove is formed along a predetermined pattern, an adhesive sheet is placed on the mold member, and the adhesive sheet is made pressure contact with the wire. The wire is removed from the molded member together with the sheet, whereby a sheet, to the surface of which the wire formed into the pattern is secured, is obtained. The sheet and the wire are then alternately stacked, whereby a thin flat coil can be obtained.

BRIEF SUMMARY OF THE INVENTION

Problems to be Solved

In the case that flat coils disclosed in Japanese Patent Application Laid-Open No. 2004-255182 are stacked in layers to form a gradient magnetic field coil, the flat coil requires a thickness for securely obtaining the space for allowing the crossover wire to pass through.

The method disclosed in Japanese Patent Application Laid-Open No. 2007-307034 is effective as a method for reducing the thickness of a gradient magnetic field coil. However, the gradient magnetic field coil to be produced requires a thickness for securely obtaining the spaces for allowing the crossover wires to pass through. Furthermore, the method requires many processes to produce the coil, such as a process for disposing the wire in the groove of the molded member and a process for placing the sheet on the molded member, thereby causing cost increase.

Accordingly, in consideration of these circumstances, the present invention is intended to provide a thin gradient magnetic field coil producible at low cost and a magnetic resonance imaging apparatus incorporating the gradient magnetic field coils.

Means to Solving the Problem

The coil device according to the present invention in which a first coil and a second coil, each having a flat plate shape, are stacked with each other, is characterized in that the first coil has a first clearance section, and that part or whole of a lead wire drawn out from the inside to the peripheral portion of the second coil while striding over the second coil is accommodated in the first clearance section.

With the present invention, the first coil has the first clearance section, and part or whole of the lead wire drawn out from the inside to the peripheral portion of the second coil while striding over the second coil is accommodated in the first clearance section. Hence, it is not necessary to provide a space between the first coil and the second coil, whereby the first coil and the second coil can be stacked in close contact with each other. Hence, the thickness of the flat coil can be reduced by the diameter of the crossover wire.

The coil device according to the present invention is characterized in that the first coil has two coil pieces, and that the two coil pieces are disposed, side by side, with the first clearance section being interposed between the coil pieces.

With the present invention, the first coil has the two coil pieces, the two coil pieces are disposed, side by side, with the first clearance section being interposed between the coil pieces, and part or whole of the lead wire drawn out from the inside to the peripheral portion of the second coil while striding over the second coil is accommodated in the clearance section. Hence, it is not necessary to provide a space between the first coil and the second coil, whereby the thickness of the flat coil can be reduced.

The coil device according to the present invention is characterized in that a connection section for connecting the two coil pieces of the first coil is provided.

With the present invention, part or whole of the lead wire drawn out from the inside to the peripheral portion of the second coil while striding over the second coil is accommodated in the clearance section. Hence, it is not necessary to provide a space between the first coil and the second coil, whereby the thickness of the flat coil can be reduced.

The coil device according to the present invention is characterized in that a third coil having a flat plate shape is further provided, that the second coil, the first coil and the third coil are stacked in this order, that the third coil has a second clearance section, that part or whole of a lead wire drawn out from the inside to the peripheral portion of the first coil while striding over the first coil is accommodated in the second clearance section, and that part or whole of a lead wire drawn out from the inside to the peripheral portion of the third coil while striding over the third coil is accommodated in the first clearance section.

With the present invention, the third coil has the second clearance section, and part or whole of the lead wire drawn out from the inside to the peripheral portion of the first coil while striding over the first coil is accommodated in the second clearance section. Part or whole of the lead wire drawn out from the inside to the peripheral portion of the third coil while striding over the third coil is accommodated in the first clearance section. Hence, it is not necessary to provide a space between the first coil and the third coil, and it is not necessary to provide a space for allowing the crossover wire to pass through over the third coil, whereby the thickness of the flat coil can be reduced further by two times the diameter of the crossover wire.

The coil device according to the present invention is characterized in that the third coil has two coil pieces, and that the two coil pieces are disposed, side by side, with the second clearance section being interposed between the coil pieces.

With the present invention, the third coil has two coil pieces, the two coil pieces are disposed, side by side, with the second clearance section being interposed between the coil pieces, and part or whole of the lead wire drawn out from the inside to the peripheral portion of the first coil while striding over the first coil is accommodated in the second clearance section. Hence, it is not necessary to provide a space between the first coil and the third coil to allow the crossover wire to pass through, whereby the thickness of the flat coil can be reduced.

The coil device according to the present invention is characterized in that a second connection section for connecting the two coil pieces of the third coil is provided.

With the present invention, part or whole of the lead wire drawn out from the inside to the peripheral portion of the first coil while striding over the first coil is accommodated in the second clearance section. Hence, it is not necessary to provide a space between the first coil and the third coil, whereby the thickness of the flat coil can be reduced.

The magnetic resonance imaging apparatus according to the present invention is characterized in that the apparatus is equipped with the coil device according to any one of the above-mentioned aspects as a gradient magnetic field coil.

With the present invention, the thickness of the gradient magnetic field coil can be made thinner than that of the prior art. Since the distance between the subject and the static magnets can be reduced by the reduced amount of the thickness, the intensity of the static magnetic field can be increased. Furthermore, the space for the installation of the gradient magnetic field coil can be decreased.

Effect of the Invention

With the present invention, part or whole of the lead wire drawn out from the inside of the second coil to the peripheral portion thereof while striding over the second coil is accommodated in the first clearance section formed in the first coil.

Hence, the first coil and the second coil can be stacked in close contact with each other, whereby the thickness of the whole flat coil can be reduced.

BRIEF DESCRIPTION OF THE DRAWINGS

FIG. 4 is a plan view showing the structure of the X-coil.

BEST MODE FOR CARRYING OUT THE INVENTION

Embodiment 1

Figure 1:
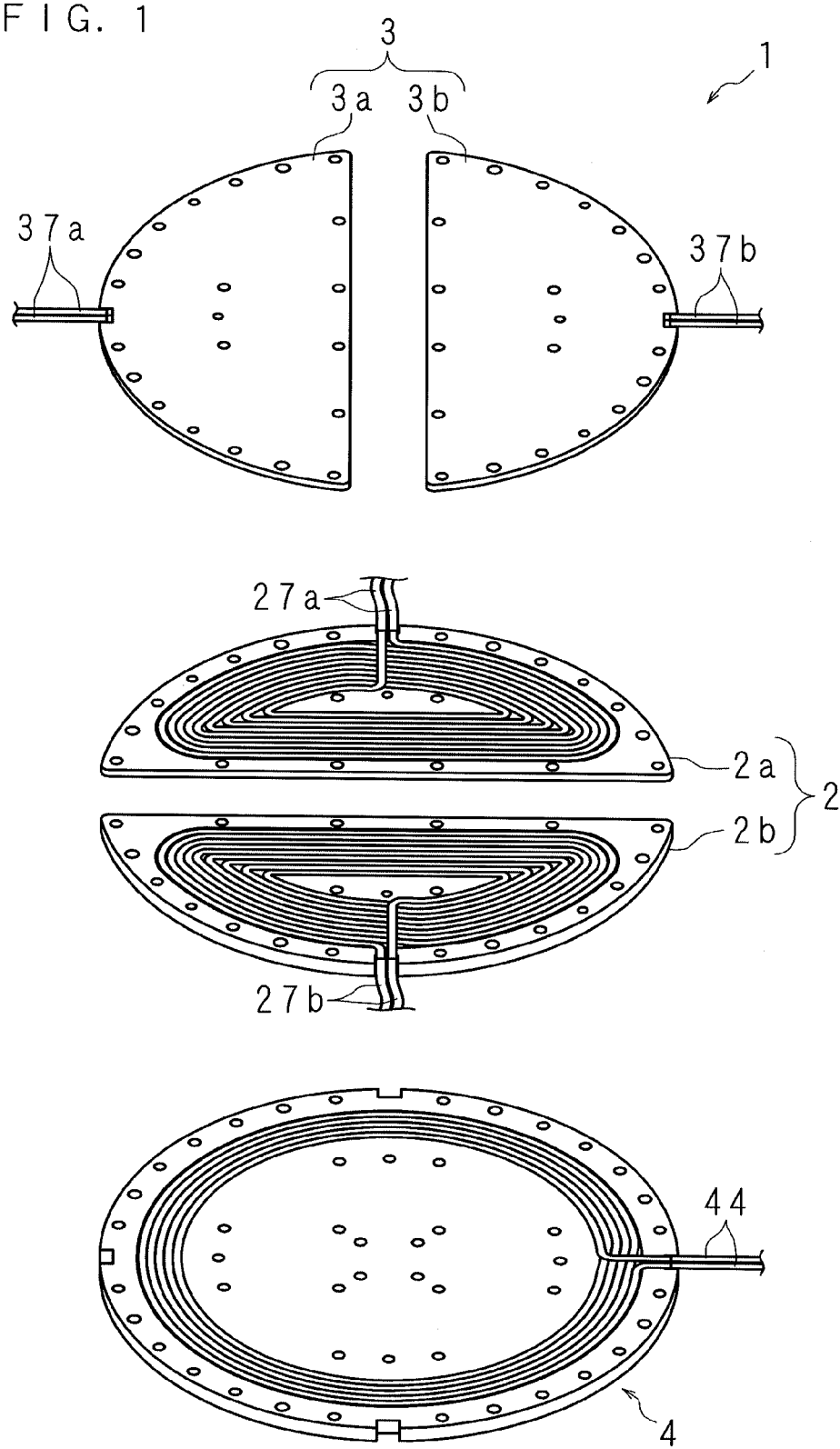
FIG. 1 is an exploded perspective view showing the structure of a gradient magnetic field coil according to Embodiment 1.

Embodiment 1 will be described below specifically referring to the drawings.

In this embodiment, a coil device according to the present invention will be described as an example that is applied to the gradient magnetic field coil of an MRI apparatus. As another example, the coil device can also be applied to a gradient magnetic field coil for use in an electron spin resonance apparatus.

FIG. 1 is an exploded perspective view showing the structure of a gradient magnetic field coil according to Embodiment 1.

The gradient magnetic field coil 1 (coil device) has a three-layer structure in which a Z-coil 4 (second coil), an X-coil 2 (first coil) and a Y-coil 3 (third coil), each having a flat plate shape in a plan view, are stacked. A plurality of screw holes are formed along the outer edge of each coil. Screws, not shown, are inserted through the screw holes to connect the X-coil 2, the Y-coil 3 and the Z-coil 4 to one another.

Of the coils constituting the gradient magnetic field coil 1, the X-coil 2 includes two X-coil pieces 2a and 2b. The Y-coil 3 includes two Y-coil pieces 3a and 3b. All the X-coil pieces 2a and 2b and the Y-coil pieces 3a and 3b have the same shape, that is, an arc-like shape in a plan view.

The curved parts of the X-coil pieces 2a and 2b have the same radius of curvature as that of the circumference of the Z-coil 4. The X-coil pieces 2a and 2b are stacked on the Z-coil 4 so that the straight part of the X-coil piece 2a is parallel with the straight part of the X-coil piece 2b. The X-coil pieces 2a and 2b are stacked on the Z-coil 4 so that the curved part of the X-coil pieces 2a and 2b are aligned with the circumference part of the Z-coil 4. With this stacking, a space (clearance section) is formed between the X-coil piece 2a and the X-coil piece 2b. Similarly in the Y-coil 3, a space (second clearance section) is formed between the Y-coil piece 3a and the Y-coil piece 3b.

The X-coil 2 and the Y-coil 3 are disposed so that the straight part of the X-coil piece 2a and the X-coil piece 2b are orthogonal to the straight parts of the Y-coil piece 3a and the Y-coil piece 3b.

The X-coil pieces 2a and 2b are equipped with lead wires 27a and 27b (drawn-out wires), respectively. The Y-coil pieces 3a and 3b are equipped with lead wires 37a and 37b (drawn-out wires), respectively. The Z-coil 4 is equipped with lead wires 44 (drawn-out wires).

Since each of the X-coil 2 and the Y-coil 3 includes two coil pieces, the drawing-out positions of the lead wires are provided at two places in each coil. Since the X-coil 2 and the Y-coil 3 are disposed so as to be orthogonal to each other as described above, the lead wires 27a and 27b of the X-coil 2 and the lead wires 37a and 37b of the Y-coil 3 are all placed at different positions. Hence, the drawing-out positions of the lead wires of the gradient magnetic field coil 1 are located at least at four places. The drawing-out position of the Z-coil 4 is aligned with one of the drawing-out positions of the Y-coil 3 to minimize the number of the drawing-out positions. The drawing-out positions of the respective lead wires are placed at equal intervals in the circumferential direction. For example, in the case that the lead wires 44 of the Z-coil 4 are placed at the three o'clock position, the lead wires 27a and 27b of the X-coil 2 are placed at the twelve and the six o'clock positions, respectively. The lead wires 37a and 37b of the Y-coil 3 are placed at the nine and the three o'clock positions, respectively.

Figure 2:
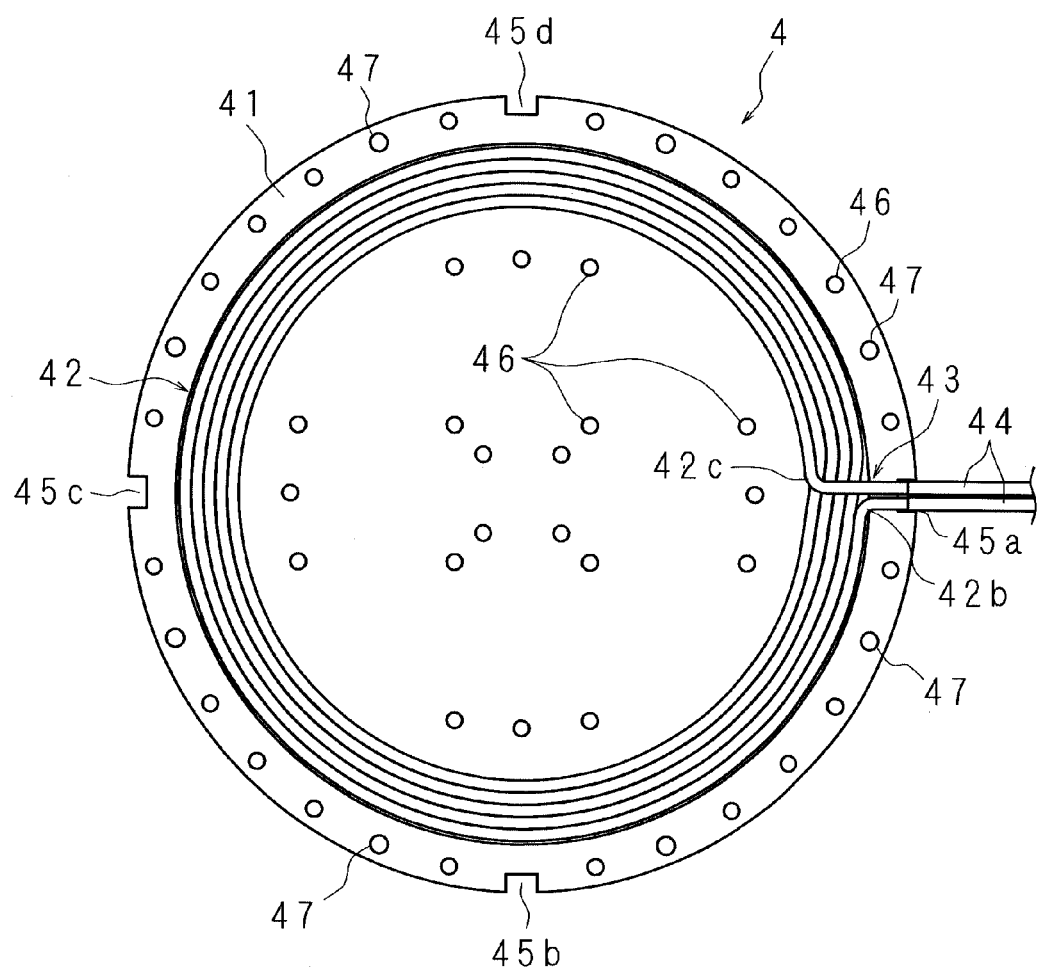
FIG. 2 is a plan view showing the structure of a Z-coil.

The Z-coil 4 is described using FIG. 2. FIG. 2 is a plan view showing the structure of the Z-coil 4.

The Z-coil 4 includes a Z-coil bobbin 41, a coil winding portion 42, a crossover wire 43 and lead wires 44.

The Z-coil bobbin 41 (hereafter referred to as "bobbin 41") has a substantially disc-like shape in a plan view.

The bobbin 41 is made of an electrically insulating resin, such as PET (polyethylene terephthalate), PBT (polybuthylene terephthalate) or SPS (syndiotactic polystyrene).

Notches 45a, 45b, 45c and 45d, screw holes 46 and screw holes 47 are formed in the bobbin 41. In addition, a groove, not shown, is formed on one face of the bobbin 41.

The groove is a single spiral continuous groove that is formed with a predetermined clearance from the outer edge. Each groove is substantially concentric with the outer edge of the bobbin 41. The notches 45a, 45b, 45c and 45d, the screw holes 46 and the screw holes 47 are provided between the outer edge and the groove.

The coil winding portion 42 is formed by embedding a coil wire made of a conductor, such as a copper wire, along the groove. The coil wire is secured by molding to the bobbin 41 using epoxy resin.

The resin to be used for the mold securing is not limited to epoxy resin. A resin having insulation, heat resistance and hardness similar to those of epoxy resin, such as polyurethane or polyester, may also be used.

The winding end 42b of the coil winding is a position inside the inner circumference of the bobbin 41 away from the outer edge of the bobbin 41 by a predetermined distance in the radial direction. The reason for this is so that one lead wire 44 connected to the coil winding is secured by molding to the bobbin 41 at the peripheral portion of the bobbin 41. The circumferential position of the winding start 42c of the coil winding is made substantially equal to that of the winding end 42b of the coil winding. The reason for this is so that the other lead wire 44 (drawn-out wire) connected to the winding start 42c (on the inside of the second coil) is secured by molding to the bobbin 41 at the peripheral portion (the peripheral portion of the second coil) of the bobbin 41 together with the one lead wire 44 and so that the two lead wires 44 are drawn out to the outside of the gradient magnetic field coil 1.

The notch 45*a* is used to allow the lead wires 44 connected to the coil winding to be drawn out to the outside of the gradient magnetic field coil 1. The notch 45*a* is provided so that the circumferential position of the winding end 42*b* of the coil winding is close to that of the winding start 42*c* of the coil winding. The notches 45*a* to 45*d* are provided at positions on the outer edge side from the coil winding portion 42. The notches 45*a*, 45*b*, 45*c* and 45*d* are formed by notching the bobbin 41 from the outer edge portion thereof to the inside and by cutting out part of the bobbin 41 into a substantially rectangular shape.

The notches 45*a*, 45*b*, 45*c* and 45*d* are formed at equal intervals in the circumferential direction.

The one lead wire 44 is connected to the winding end 42*b* of the coil winding portion 42 and is drawn out to the outside of the gradient magnetic field coil 1 from the notch 45*a*. The other lead wire 44 connected to the winding start 42*c* of the coil winding portion 42 strides (serving as the crossover wire 43) over the coil winding portion 42 and is drawn out to the outside of the gradient magnetic field coil 1 from the notch 45*a*.

The screw holes 46 are used to allow screws for stacking and securing the Z-coil 4 and the X-coil 2 and for stacking and securing the X-coil 2 and the Y-coil 3 to be inserted therethrough. The screw holes 46 are formed along the outer edge of the bobbin 41 at positions on the outer edge side from the coil winding portion 42 and also formed inside the coil winding portion 42 as necessary. The screw holes 47 are used to allow screws for securing the gradient magnetic field coil 1 to another apparatus, such as an MRI apparatus, to be inserted therethrough. In addition to the screw holes 46, the screw holes 47 are formed along the outer edge of the bobbin 41 at positions on the outer edge side from the coil winding portion 42 as necessary.

In the case that the diameter of the coil winding is set to 1.0 mm, the thickness of the bobbin 41 at a portion without the groove is set to 1.6 mm, the width of the groove is set to 1.1 mm, and the depth of the groove is set to 1.2 mm. With this setting, the coil wire is embedded into the groove and does not protrude to the surface of the bobbin 41, thereby being preferably disposed.

Figure 3:
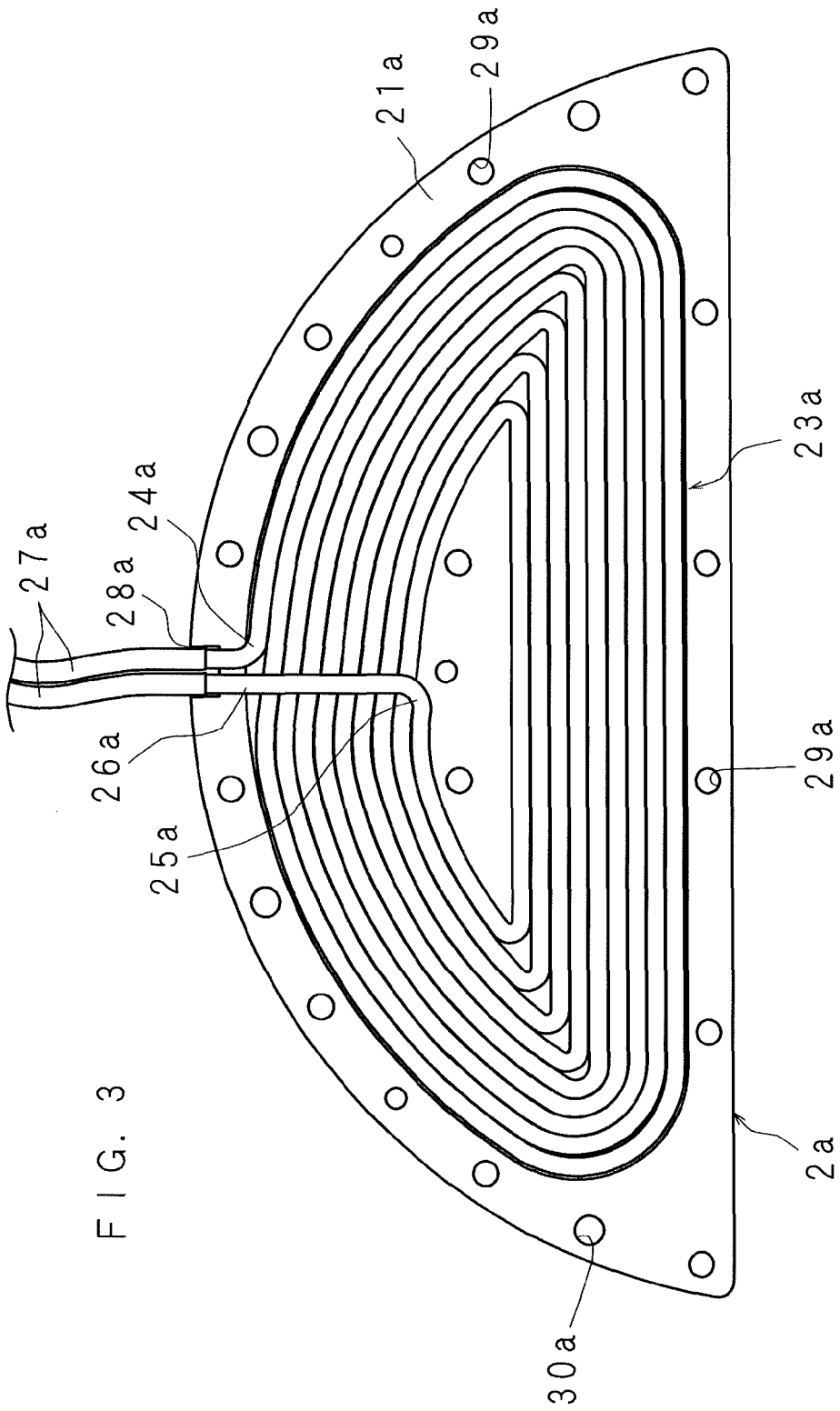
FIG. 3 is a plan view showing the structure of an X-coil piece constituting an X-coil.

The X-coil piece 2*a* constituting the X-coil 2 will be described using FIG. 3. FIG. 3 is a plan view showing the structure of the X-coil piece constituting the X-coil.

The X-coil piece 2*a* includes an X-coil bobbin 21*a*, a coil winding portion 23*a*, a crossover wire 26*a* and lead wires 27*a*.

The X-coil bobbin 21*a* (hereafter referred to as "bobbin 21*a*") has an arc-like shape in a plan view. The curved part of the bobbin 21*a* and the curved part of the Z-coil bobbin 41 are formed so as to have the same radius of curvature.

The bobbin 21*a* is made of an electrically insulating resin, such as PET (polyethylene terephthalate), PBT (polybuthylene terephthalate) or SPS (syndiotactic polystyrene).

A notch 28*a*, screw holes 29*a* and screw holes 30*a* are formed in the bobbin 21*a*. A groove, not shown, is formed on one face of the bobbin 21*a*. The coil winding portion 23*a* is formed by embedding a coil wire made of a conductor, such as a copper wire, along the groove.

The groove is a single continuous groove that is formed with a predetermined clearance from the outer edge. The groove is provided so that a coil winding having a shape substantially similar to that of the outer edge of the bobbin 21*a* is formed. The notch 28*a*, the screw holes 29*a* and the screw holes 30*a* are provided between the outer edge and the groove.

The coil winding portion 23*a* is formed by embedding a coil wire made of a conductor, such as a copper wire, along the groove. The coil wire is secured by molding to the bobbin 21*a* using an electrically insulating resin, such as epoxy resin, polyurethane or polyester.

The winding end 24*a* of the coil winding is a position inside the inner circumference of the bobbin 21*a* away from the outer edge of the bobbin 21*a* by a predetermined distance in the radial direction. The reason for this is so that one lead wire 27*a* connected to the coil winding is secured by molding to the bobbin 21*a* at the peripheral portion (the peripheral portion of the first coil) of the bobbin 21*a*.

The winding end 24*a* is close to the middle point of the circular arc forming part of the periphery of the bobbin 21*a*. The circumferential position of the winding start 25*a* of the coil winding is made substantially equal to that of the winding end 24*a* of the coil winding. The reason for this is so that the other lead wire 27*a* (drawn-out wire) connected to the winding start 25*a* (on the inside of the first coil) is secured by molding to the bobbin 21*a* at the peripheral portion of the bobbin 21*a* together with the one lead wire 27*a* and so that the two lead wires 27*a* are drawn out to the outside of the gradient magnetic field coil 1.

The notch 28*a* is used to allow the lead wires 27*a* connected to the coil winding to be drawn out to the outside of the gradient magnetic field coil 1. The notch 28*a* is provided so that the circumferential position of the winding end 24*a* of the coil winding is close to that of the winding start portion 25*a* thereof. The notch 28*a* is formed at a position on the outer edge side from the coil winding portion 23*a*. The notch 28*a* is formed by notching the bobbin 21*a* from the outer edge portion thereof to the inside and by cutting out part of the bobbin 21*a* into a substantially rectangular shape.

The one lead wire 27*a* is connected to the winding end 24*a* of the coil winding portion 23*a* and is drawn out to the outside of the gradient magnetic field coil 1 from the notch 28*a*. The other lead wire 27*a* (drawn-out wire) is connected to the winding start 25*a* of the coil winding portion 23*a* and strides (serving as the crossover wire 26*a*) over the coil winding portion 23*a* and is drawn out to the outside of the gradient magnetic field coil 1 from the notch 28*a*.

The screw holes 29*a* are used to allow screws for stacking and securing the X-coil piece 2*a* and the Z-coil 4 and for stacking and securing the X-coil piece 2*a* and the Y-coil 3 to be inserted therethrough. The screw holes 29*a* are formed along the outer edge of the bobbin 21*a* at positions on the outer edge side from the coil winding portion 23*a* and also formed inside the coil winding portion 23*a* as necessary. The screw holes 30*a* are used to allow screws for securing the gradient magnetic field coil 1 to another apparatus, such as an MRI apparatus, to be inserted therethrough. In addition to the screw holes 29*a*, the screw holes 30*a* are formed along the outer edge of the bobbin 21*a* as necessary.

In the case that the diameter of the coil winding is set to 1.0 mm, the thickness of the bobbin 21*a* at a portion without the groove is set to 1.6 mm, the width of the groove is set to 1.1 mm, and the depth of the groove is set to 1.2 mm. With this setting, the coil wire is embedded into the groove and does not protrude to the surface of the bobbin 21*a*, thereby being preferably disposed.

The other X-coil piece 2*b* constituting the X-coil 2 has the same structure as that of the X-coil piece 2*a*. FIG. 4 is a plan view showing the structure of the X-coil. The X-coil 2 has the X-coil piece 2a and the X-coil piece 2b. The X-coil piece 2b includes an X-coil bobbin 21b, a coil winding portion 23b, a crossover wire 26b and lead wires 27b.

The X-coil bobbin 21b (hereafter referred to as "bobbin 21b") for use in the X-coil piece 2b is similar to the X-coil bobbin 21a for use in the X-coil piece 2a.

A groove, not shown, is formed on one face of the bobbin 21b. The coil winding portion 23b is formed by embedding a coil wire along the groove. The coil wire is secured by molding to the bobbin 21b using epoxy resin, for example.

The winding end 24b and the winding start 25b (on the inside of the first coil) of the coil winding are formed at positions similar to those of the winding end 24a and the winding start 25a of the X-coil piece 2a, respectively. One lead wire 27b connected to the winding end 24b is drawn out to the outside of the gradient magnetic field coil 1 from a notch 28b. The other lead wire 27b (drawn-out wire) connected to the winding start 25b strides (serving as the crossover wire 26b) over the coil winding and is secured by molding to the bobbin 21b on the inside of the notch 28b. The other lead wire 27b is also drawn out to the outside of the gradient magnetic field coil 1 from the notch 28b.

The screw holes 29b and the screw holes 30b are also formed for purposes and at positions similar to those of the screw holes 29a and the screw holes 30a of the X-coil piece 2a, respectively.

The X-coil 2 is disposed so that the straight part of the X-coil piece 2a is parallel with the straight part of the X-coil piece 2b.

When disposed on the Z-coil 4, the X-coil 2 is further installed so that the circular arc portions of the X-coil pieces 2a and 2b are aligned with the circular arc portion of the Z-coil 4.

Figure 5:
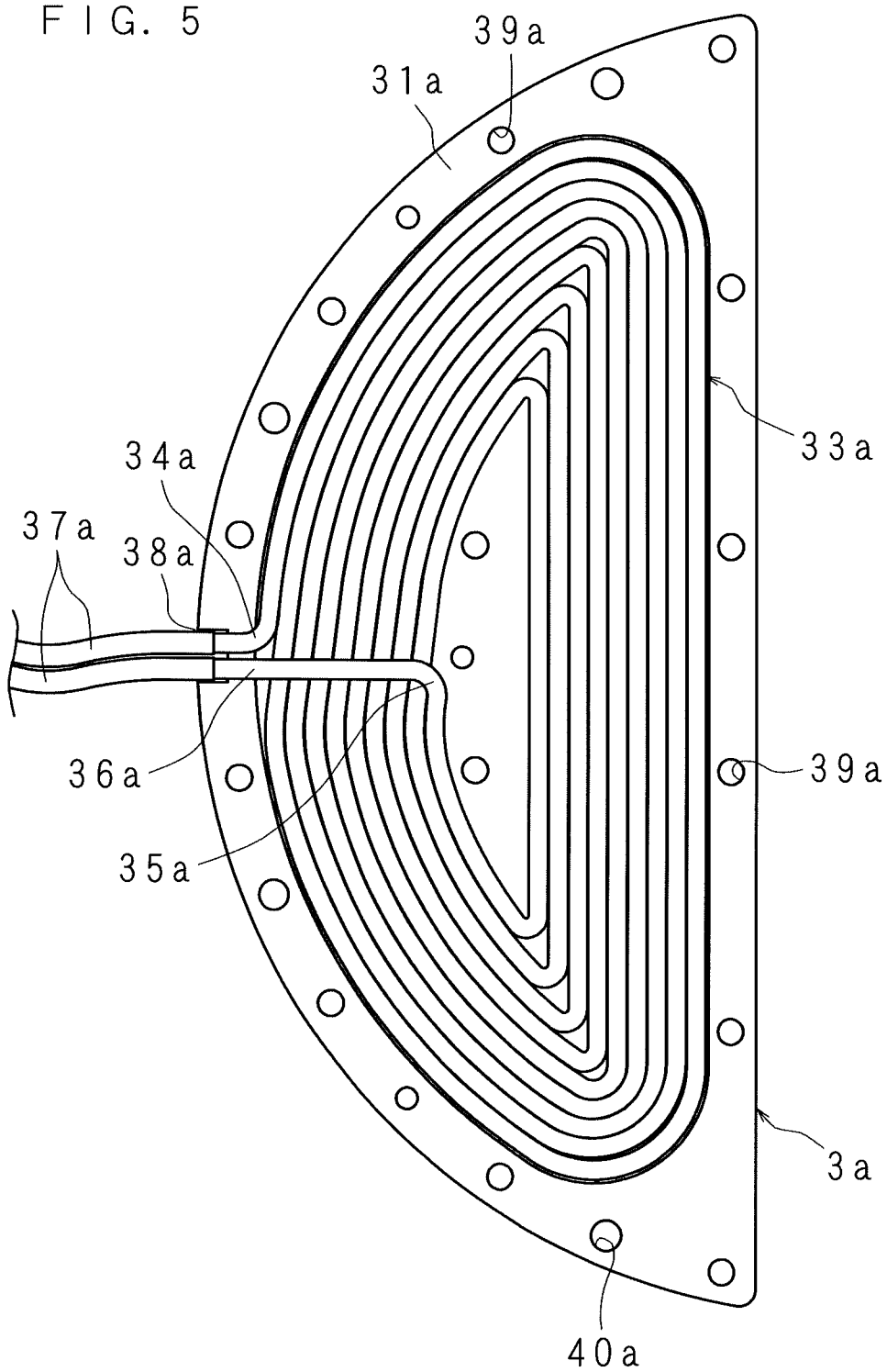
FIG. 5 is a plan view showing the structure of a Y-coil piece constituting a Y-coil.

The Y-coil piece 3a constituting the Y-coil 3 will be described using FIG. 5. FIG. 5 is a plan view showing the structure of the Y-coil piece 3a constituting the Y-coil 3.

The Y-coil piece 3a includes a Y-coil bobbin 31a, a coil winding portion 33a, a crossover wire 36a and lead wires 37a.

The Y-coil bobbin 31a (hereafter referred to as "bobbin 31a") has an arc-like shape in a plan view. The shape of the bobbin 31a is similar to that of the above-mentioned bobbin 21a.

The bobbin 31a is made of an electrically insulating resin, such as PET (polyethylene terephthalate), PBT (polybuthylene terephthalate) or SPS (syndiotactic polystyrene).

A notch 38a, screw holes 39a and screw holes 40a are formed in the bobbin 31a. A groove, not shown, is formed on one face of the bobbin 31a. The coil winding portion 33a is formed by embedding a coil wire made of a conductor, such as a copper wire, along the groove.

The groove is a single continuous groove that is formed with a predetermined clearance from the outer edge. The groove is provided so that a coil winding having a shape substantially similar to that of the outer edge of the bobbin 31a is formed. The notch 38a, the screw holes 39a and the screw holes 40a are provided between the outer edge and the groove.

The coil winding portion 33a is formed by embedding a coil wire made of a conductor, such as a copper wire, along the groove. The coil wire is secured by molding to the bobbin 31a using an electrically insulating resin, such as epoxy resin, polyurethane or polyester.

The winding end 34a of the coil winding is a position inside the inner circumference of the bobbin 31a away from the outer edge of the bobbin 31a by a predetermined distance in the radial direction. The reason for this is so that one lead wire 37a connected to the coil winding is secured by molding to the bobbin 31a at the peripheral portion (the peripheral portion of the third coil) of the bobbin 31a.

The position of the winding end portion 34a is close to the middle point of the circular arc forming part of the periphery of the bobbin 31a.

The circumferential position of the winding start 35a of the coil winding is made substantially equal to that of the winding end 34a of the coil winding. The reason for this is so that the other lead wire 37a (drawn-out wire) connected to the winding start 35a (on the inside of the third coil) is secured by molding to the bobbin 31a at the peripheral portion of the bobbin 31a together with the one lead wire 37a and so that the lead wires are drawn out to the outside of the gradient magnetic field coil 1.

The notch 38a is used to allow the lead wires 37a connected to the coil winding to be drawn out to the outside of the gradient magnetic field coil 1. The notch 38a is provided so that the circumferential position of the winding end 34a of the coil winding is close to that of the winding start 35a thereof. The notch 38a is formed at a position on the outer edge side from the coil winding portion 33a. The notch 38a is formed by notching the bobbin 31a from the outer edge portion thereof to the inside and by cutting out part of the bobbin 31a into a substantially rectangular shape.

The one lead wire 37a is connected to the winding end 34a of the coil winding portion 33a and is drawn out to the outside of the gradient magnetic field coil 1 from the notch 38a. The other lead wire 37a (drawn-out wire) is connected to the winding start 35a of the coil winding portion 33a and strides (serving as the crossover wire 36a) over the coil winding portion 33a and is drawn out to the outside of the gradient magnetic field coil 1 from the notch 38a.

The screw holes 39a are used to allow screws for stacking and securing the Y-coil piece 3a and the Z-coil 4 and for stacking and securing the Y-coil piece 3a and the X-coil 2 to be inserted therethrough. The screw holes 39a are formed along the outer edge of the bobbin 31a at positions on the outer edge side from the coil winding portion 33a and inside the coil winding portion 33a as necessary. The screw holes 40a are used to allow screws for securing the gradient magnetic field coil 1 to another apparatus, such as an MRI apparatus, to be inserted therethrough. In addition to the screw holes 39a, the screw holes 40a are formed along the outer edge of the bobbin 31a as necessary.

In the case that the diameter of the coil winding is set to 1.0 mm, the thickness of the bobbin 31a at a portion without the groove is set to 1.6 mm, the width of the groove is set to 1.1 mm, and the depth of the groove is set to 1.2 mm. With this setting, the coil wire is embedded into the groove and does not protrude to the surface of the bobbin 31a, thereby being preferably disposed.

Figure 6:
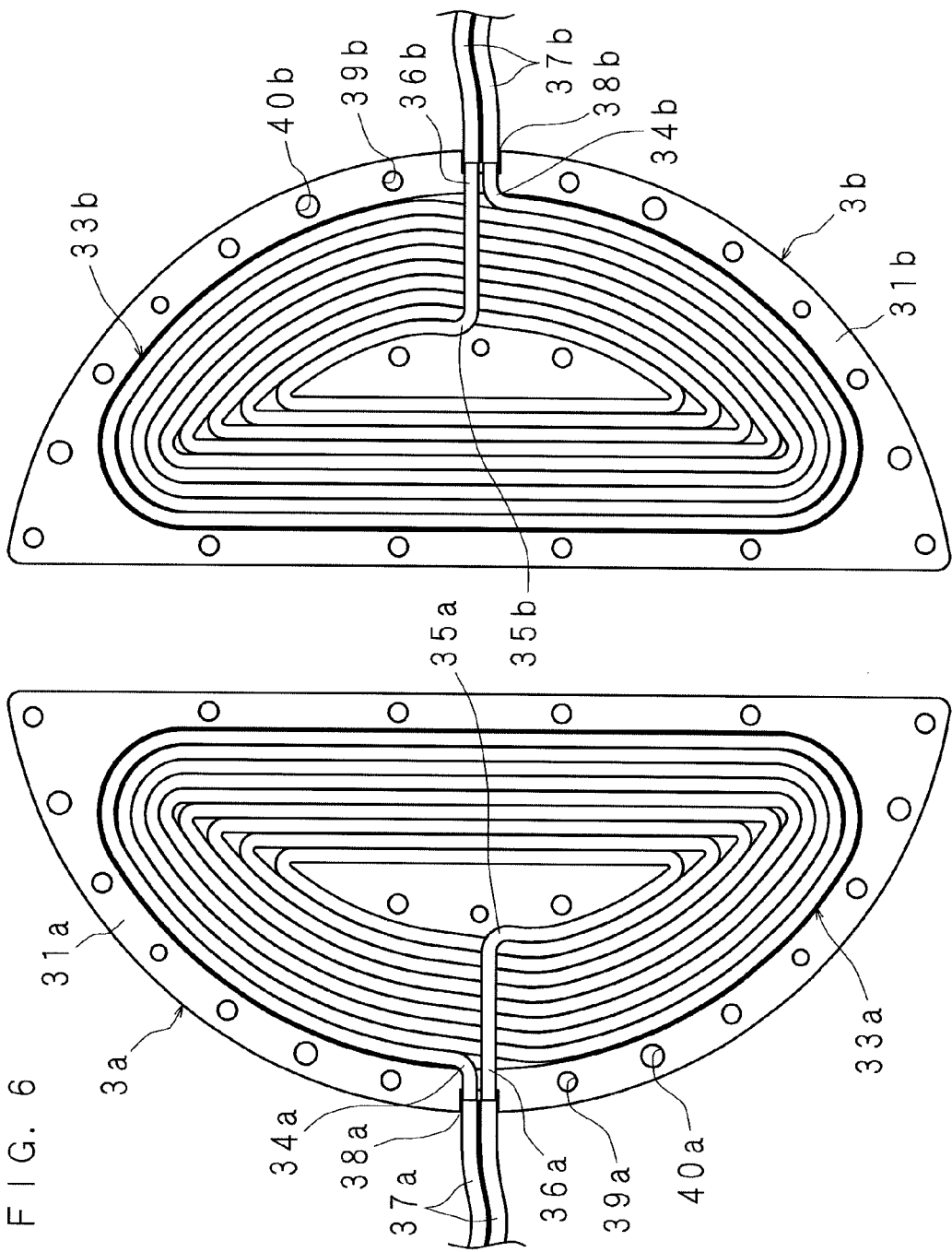
FIG. 6 is a plan view showing the structure of the Y-coil.

The other Y-coil piece 3b constituting the Y-coil 3 has the same structure as that of the Y-coil piece 3a. FIG. 6 is a plan view showing the structure of the Y-coil. The Y-coil 3 has the Y-coil piece 3a and the Y-coil piece 3b. The Y-coil piece 3b includes a Y-coil bobbin 31b, a coil winding portion 33b, a crossover wire 36b and lead wires 37b.

The Y-coil bobbin 31b (hereafter referred to as "bobbin 31b") for use in the Y-coil piece 3b is similar to the Y-coil bobbin 31a for use in the Y-coil piece 3a.

A groove, not shown, is formed on one face of the bobbin 31b. The coil winding portion 33b is formed by embedding a coil wire along the groove. The coil wire is secured by molding to the bobbin 31b using epoxy resin, for example.

The winding end 34b and the winding start 35b (on the inside of the third coil) of the coil winding are formed at positions similar to those of the winding end 34a and the winding start 35a of the Y-coil piece 3a, respectively. One lead wire 37b connected to the winding end 34b is drawn out to the outside from a notch 38b. The other lead wire 37b (drawn-out wire) connected to the winding start 35b strides (serving as the crossover wire 36b) over the coil winding and is secured by molding to the bobbin 31b on the inside of the notch 38b. The other lead wire 37b is also drawn out to the outside of the gradient magnetic field coil 1 from the notch 38b.

The screw holes 39b and the screw holes 40b are also formed for purposes and at positions similar to those of the screw holes 39a and the screw holes 40a of the Y-coil piece 3a, respectively.

The Y-coil 3 is disposed so that the straight part of the Y-coil piece 3a is parallel with the straight part of the Y-coil piece 3b.

When disposed on the X-coil 2, the Y-coil 3 is further installed so that the circular arc parts of the Y-coil pieces 3a and 3b are aligned with the circular arc part of the X-coil 2 and the circular arc part of the Z-coil 4.

Figure 7:
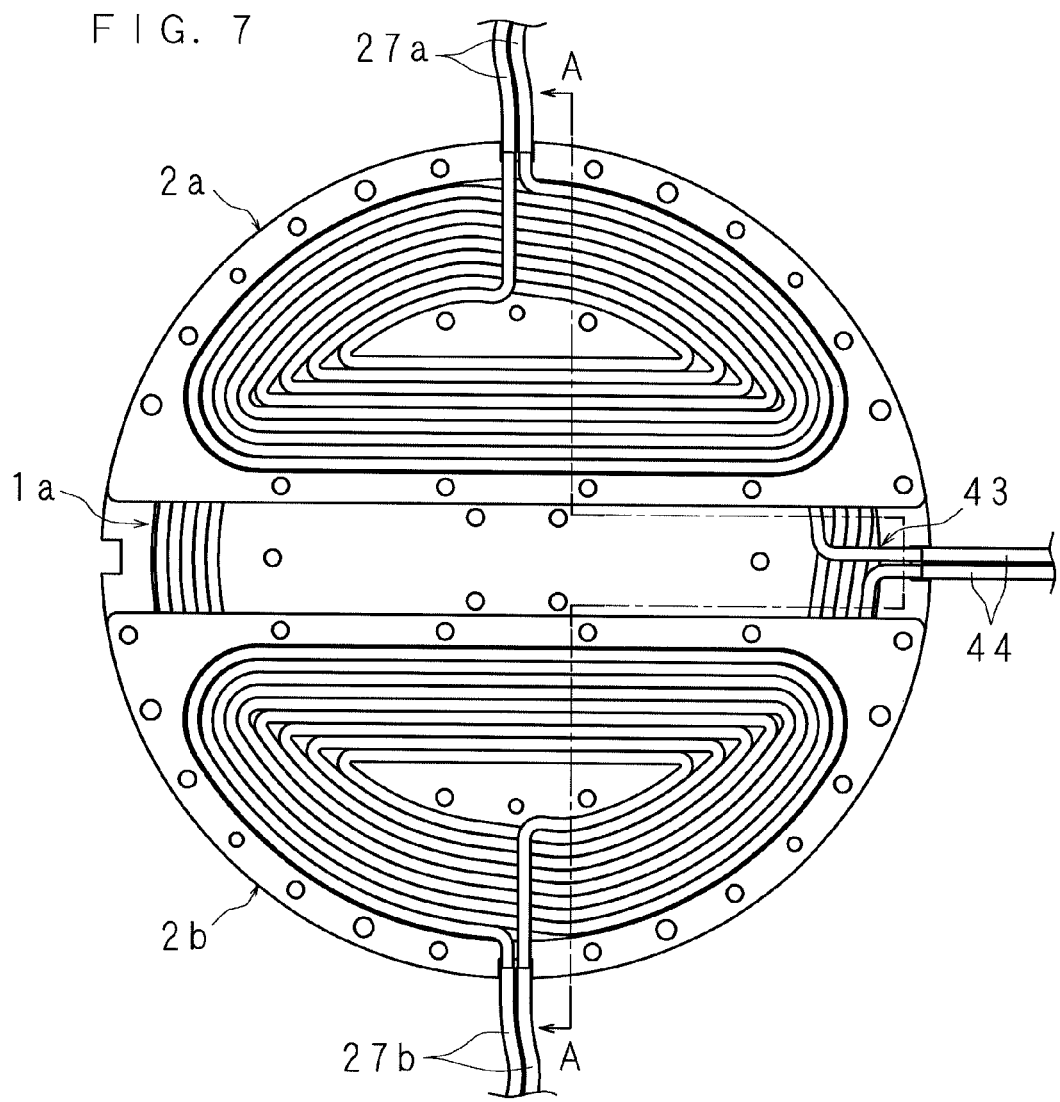
FIG. 7 is a plan view showing the positional relationship between the X-coil and the Z-coil in the gradient magnetic field coil according to Embodiment 1.
Figure 8:
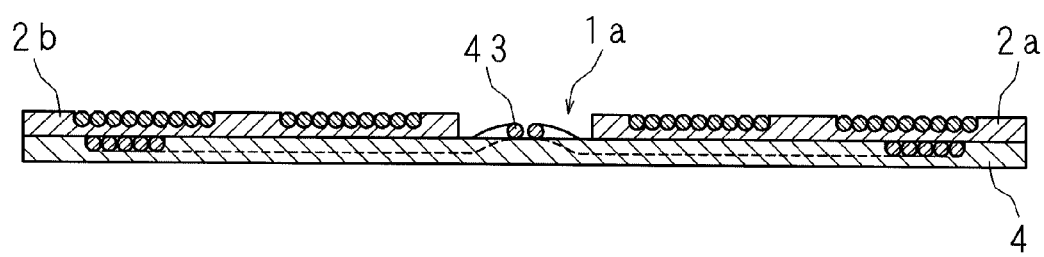
FIG. 8 is a sectional schematic view taken on line A-A of FIG. 7.

FIG. 7 is a plan view showing the positional relationship between the X-coil and the Z-coil in the gradient magnetic field coil according to Embodiment 1. FIG. 8 is a sectional schematic view taken on line A-A of FIG. 7.

As shown in FIGS. 7 and 8, the Z-coil 4 is placed while the coil winding portion 42 is oriented upward, and the X-coil 2 including the X-coil piece 2a and the X-coil piece 2b is stacked on the Z-coil 4. The X-coil pieces 2a and 2b are stacked on the Z-coil 4 while the coil winding portions 23a and 23b thereof are oriented upward, just as in the case of the Z-coil 4. The stacking is performed so that the circular arc part of the Z-coil 4 is aligned with the circular arc part of the X-coil piece 2a. The stacking is also performed so that the circular arc part of the Z-coil 4 is aligned with the circular arc part of the X-coil piece 2b. The X-coil 2 is disposed so that the straight part of the X-coil piece 2a is parallel with the straight part of the X-coil piece 2b. Hence, a clearance (hereafter referred to as "first clearance section 1a") serving as a space having a substantially hexahedron shape including a bottom face having a substantially rectangular shape and with a height corresponding to the thickness of the X-coil pieces 2a and 2b is formed on the Z-coil 4. In other words, the X-coil piece 2a and the X-coil piece 2b are arranged, side by side, with the first clearance section 1a being interposed therebetween.

Since the height of the first clearance section 1a is larger than the diameter of the crossover wire 43, the crossover wire 43 can be accommodated in the first clearance section 1a.

In other words, the crossover wire 43 of the Z-coil 4 can pass through using the first clearance section 1a. Hence, the bobbin 41 of the Z-coil 4 can be made close contact with the bobbins 21a and 21b of the X-coil 2, whereby the thickness corresponding to the diameter of the crossover wire can be reduced from the thickness of the gradient magnetic field coil.

In FIG. 8, the groove for the coil winding provided in each bobbin is not shown. In addition, the resin for securing the crossover wire 43 and the coil winding portion 42 by molding is not shown.

Figure 9:
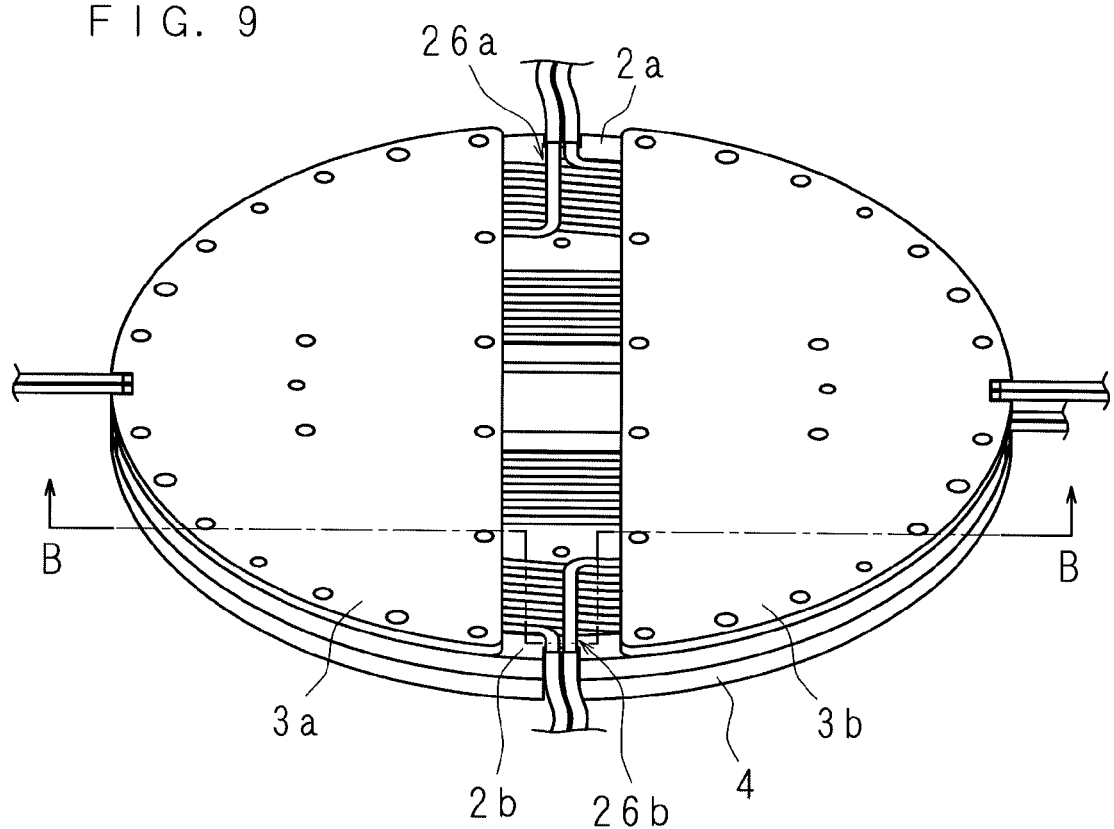
FIG. 9 is a perspective view showing the positional relationship between the X-coil and the Y-coil in the gradient magnetic field coil according to Embodiment 1.
Figure 10:
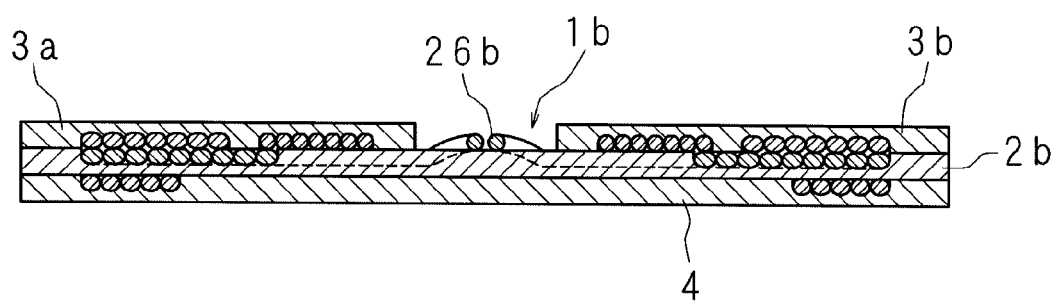
FIG. 10 is a sectional schematic view taken on line B-B of FIG. 9.

FIG. 9 is a perspective view showing the positional relationship between the X-coil and the Y-coil in the gradient magnetic field coil according to Embodiment 1. FIG. 10 is a sectional schematic view taken on line B-B of FIG. 9. As shown in FIGS. 9 and 10, the Y-coil pieces 3a and 3b are stacked on the X-coil pieces 2a and 2b. The Y-coil piece 3a is disposed so that the straight part of its outer edge is orthogonal to that of each of the X-coil pieces 2a and 2b. The Y-coil piece 3b is also disposed so that the straight part of its outer edge is orthogonal to that of each of the X-coil pieces 2a and 2b. The Y-coil pieces 3a and 3b are stacked on the X-coil pieces 2a and 2b while the coil winding pieces 33a and 33b thereof are oriented downward. The reason for this is so that the crossover wires 36a and 36b of the Y-coil pieces 3a and 3b pass through the first clearance section 1a.

Just as in the case of the X-coil 2, the Y-coil 3 is disposed so that the circular arc part of the Y-coil piece 3a and the Y-coil piece 3b are aligned with the circular arc parts of the X-coil piece 2a and the X-coil piece 2b. Hence, a second clearance section (hereafter referred to as "second clearance section 1b") serving as a space having a substantially hexahedron shape including a bottom face having a substantially rectangular shape and with a height corresponding to the thickness of the Y-coil pieces 3a and 3b is formed on the X-coil 2. In other words, the Y-coil piece 3a and the Y-coil piece 3b are arranged, side by side, with the second clearance section 1b being interposed therebetween.

The crossover wires 26a and 26b of the X-coil 2 can pass through using the second clearance section 1b, just as in the case of the first clearance section 1a. Furthermore, the crossover wires 36a and 36b of the Y-coil 3 can pass through using the first clearance section 1a, just as in the case of the crossover wire 43 of the Z-coil 4. Hence, the bobbins 31a and 31b of the Y-coil 3 can be made close contact with the bobbins 21a and 21b of the X-coil 2, whereby the thickness corresponding to two times the diameter of the crossover wire can be further reduced from the thickness of the gradient magnetic field coil.

In FIG. 10, the groove for the coil winding provided in each bobbin is not shown. In addition, the resins for securing the crossover wire 26a and the coil winding portion 23a and for securing the crossover wire 26b and the coil winding portion 23b by molding are not shown.

The crossover wires 26a and 26b of the X-coil 2, the crossover wires 36a and 36b of the Y-coil 3 and the crossover wire 43 of the Z-coil 4 can pass through using the first clearance section 1a and the second clearance section 1b as described above. No space is required to be provided between the stacked bobbins to allow the crossover wires to pass through, whereby the thickness corresponding to three times the diameter of the crossover wire in total can be reduced in comparison with the gradient magnetic field coil of the prior art.

Next, an MRI apparatus equipped with the gradient magnetic field coil 1 according to this embodiment will be described below.

Figure 11:
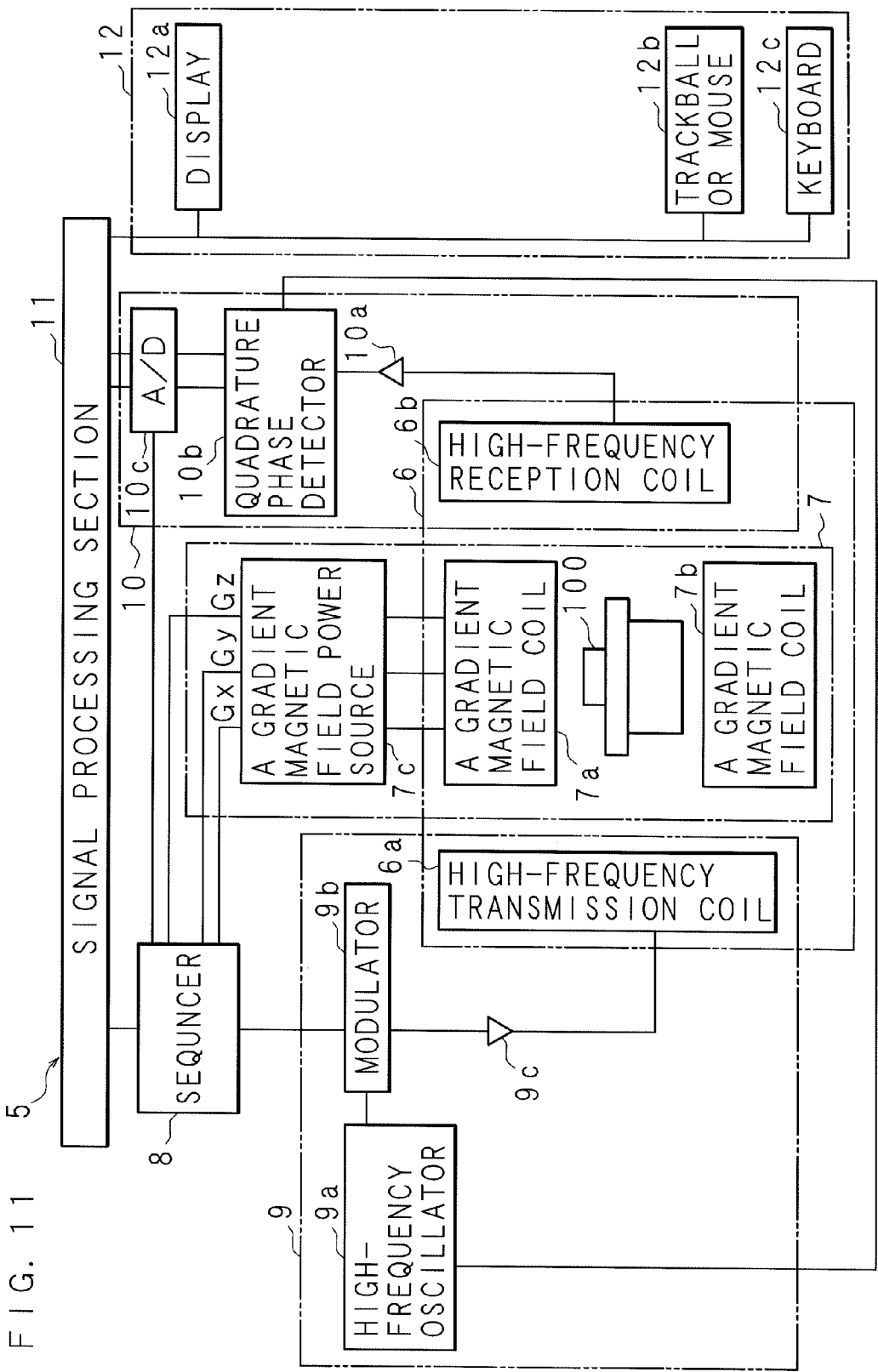
FIG. 11 is a block diagram showing the general outline of the internal configuration of an MRI apparatus equipped with the gradient magnetic field coil according to Embodiment 1.

FIG. 11 is a block diagram showing the general outline of the internal configuration of the MRI apparatus equipped with the gradient magnetic field coil according to Embodiment 1.

An MRI apparatus 5 has a magnetostatic field generation section 6, a gradient magnetic field generation section 7, a sequencer 8, an electromagnetic wave generation section 9, an electromagnetic wave detection section 10, a signal processing section 11 and an operation section 12, when classified roughly.

The magnetostatic field generation section 6 has static magnetic field magnets (not shown) over and under a subject 100 and applies a static magnetic field to the subject 100 in the direction from the lower portion to the upper portion of the MRI apparatus 5.

The gradient magnetic field generation section 7 has gradient magnetic field coils 7a and 7b according to this embodiment wound in the three-axis XYZ directions of the coordinate system (stationary coordinate system) of the MRI apparatus 5 and a gradient magnetic field power source 7c for driving the gradient magnetic field coils 7a and 7b. The Z-axis direction is the direction of the static magnetic field, the X-axis direction is the direction from the electromagnetic wave generation section 9 to the electromagnetic wave detection section 10, and the Y-axis direction is a direction orthogonal to the X-axis direction and the Z-axis direction. The gradient magnetic field generation section 7 drives the gradient magnetic field power source 7c for the gradient magnetic field coils 7a and 7b according to instructions from the sequencer 8, thereby applying gradient magnetic fields Gx, Gy and Gz in the three-axis XYZ directions to the subject 100. During the imaging of the subject 100, the gradient magnetic field generation section 7 applies slice-direction gradient magnetic field pulses (Gs) in a direction orthogonal to an imaging cross section, whereby the imaging cross section is set with respect to the subject 100.

According to instructions from the signal processing section 11, the sequencer 8 gives various instructions required for collecting the data of the tomographic image of the subject 100 to the gradient magnetic field generation section 7, the electromagnetic wave generation section 9 and the electromagnetic wave detection section 10.

The electromagnetic wave generation section 9 has a high-frequency oscillator 9a, a modulator 9b, a high-frequency amplifier 9c and a high-frequency transmission coil 6a. The electromagnetic wave generation section 9 applies high-frequency magnetic field pulses to the subject 100 so that nuclear magnetic resonance occurs in the nucleus spin of the atoms constituting the biological tissue of the subject 100.

According to instructions from the sequencer 8, the modulator 9b amplitude-modulates the high-frequency pulses given from the high-frequency oscillator 9a at predetermined timing. The modulator 9b gives amplitude-modulated high-frequency pulses to the high-frequency amplifier 9c.

The high-frequency amplifier 9c amplifies the given high-frequency pulses and gives the amplified pulses to the high-frequency transmission coil 6a disposed close to the subject 100. The high-frequency transmission coil 6a applies the amplified high-frequency pulses to the subject 100.

The electromagnetic wave detection section 10 has a high-frequency reception coil 6b, a signal amplifier 10a, a quadrature phase detector 10b and an A/D converter 10c. The electromagnetic wave detection section 10 detects an electromagnetic wave radiated from the subject 100 by the nuclear magnetic resonance of the nucleus spin of the atoms constituting the biological tissue of the subject 100, that is, an NMR signal. In the subject 100, nuclear magnetic resonance is caused by the electromagnetic wave radiated from the high-frequency transmission coil 6a, and the subject 100 transmits the NMR signal. The high-frequency reception coil 6b is close to the subject 100, detects the NMR signal transmitted from the subject 100, and gives the detected NMR signal to the signal amplifier 10a. The signal amplifier 10a amplifies the given NMR signal and gives the amplified NMR signal to the quadrature phase detector 10b. According to instructions from the sequencer 8, the quadrature phase detector 10b divides the NMR signal given from the signal amplifier 10a into two system signals, and each signal is converted into a digital signal by the A/D converter 10c and is given to the signal processing section 11.

The signal processing section 11 has a CPU, a ROM and a RAM, not shown, processes the digital signals received from the A/D converter 10c, and outputs or stores the results of the processing, for example. More specifically, in the case that the digital signals are given from the electromagnetic wave detection section 10, the signal processing section 11 performs processing, such as Fourier transformation, correction coefficient calculation and image reconstruction, on the digital signals, thereby generating a tomographic image of the subject 100.

The operation section 12 has a display 12a, a track ball or mouse 12b and a keyboard 12c. In response to the operation by an operator, the operation section 12 receives data required to control the entire MRI apparatus 5 and data to be processed by the signal processing section 11 and gives data for generating the tomographic image to the signal processing section 11. Furthermore, in response to the operation of the operator, the operation section 12 displays the tomographic image generated by the signal processing section 11 on the display 12a or stores the image in an external storage device (not shown).

Figure 12:
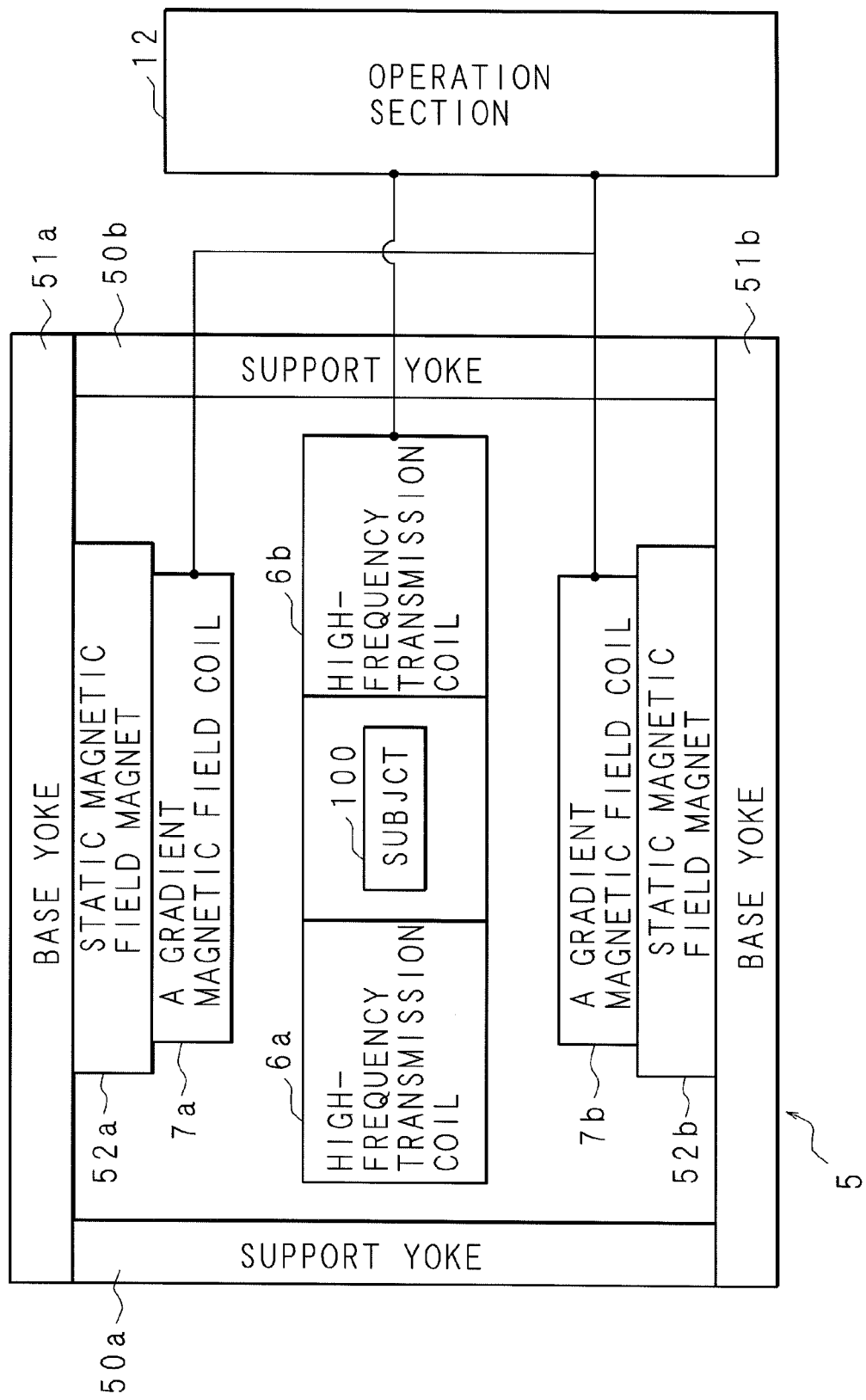
FIG. 12 is a block diagram showing the main section of the internal configuration of the MRI apparatus.

FIG. 12 is a block diagram showing the main section of the internal configuration of the MRI apparatus.

The MRI apparatus 5 has support yokes 50a and 50b, base yokes 51a and 51b, static magnetic field magnets 52a and 52b, the gradient magnetic field coils 7a and 7b, the high-frequency transmission coil 6a, the high-frequency reception coil 6b and the operation section 12.

The static magnetic field magnets 52a and 52b are disposed on the inner faces of the base yokes 51a and 51b so as to be opposed to each other, and the gradient magnetic field coils 7a and 7b are disposed on the further inner faces thereof so as to be opposed to each other. Furthermore, a static magnetic field space is formed by the high-frequency transmission coil 6a, the high-frequency reception coil 6b and the gradient magnetic field coils 7a and 7b. The subject 100 is placed inside the static magnetic field space. The static magnetic field magnets 52a and 52b, the support yokes 50a and 50b as well as the base yokes 51a and 51b are magnetically connected, whereby a magnetic circuit is formed inside the MRI apparatus 5 by these magnetic bodies.

Since the static magnetic field space is determined depending on the size of the subject 100 to be imaged by the MRI apparatus 5, the distance between the gradient magnetic field coils 7a and 7b is restricted by the size of the subject 100. On the other hand, as the distance between the subject 100 and the static magnetic field magnets 52a and 52b becomes shorter, the intensity of the static magnetic field applied to the subject 100 is increased. Hence, in the case that the gradient magnetic field coils 1 according to the present invention are adopted as the gradient magnetic field coils 7a and 7b of the MRI apparatus 5, the distance between the static magnetic field magnets 52a and 52b can be decreased without changing the size of the static magnetic field space. As a result, an effect of intensifying the magnetic field in the static magnetic field space is obtained.

Embodiment 2

Figure 13:
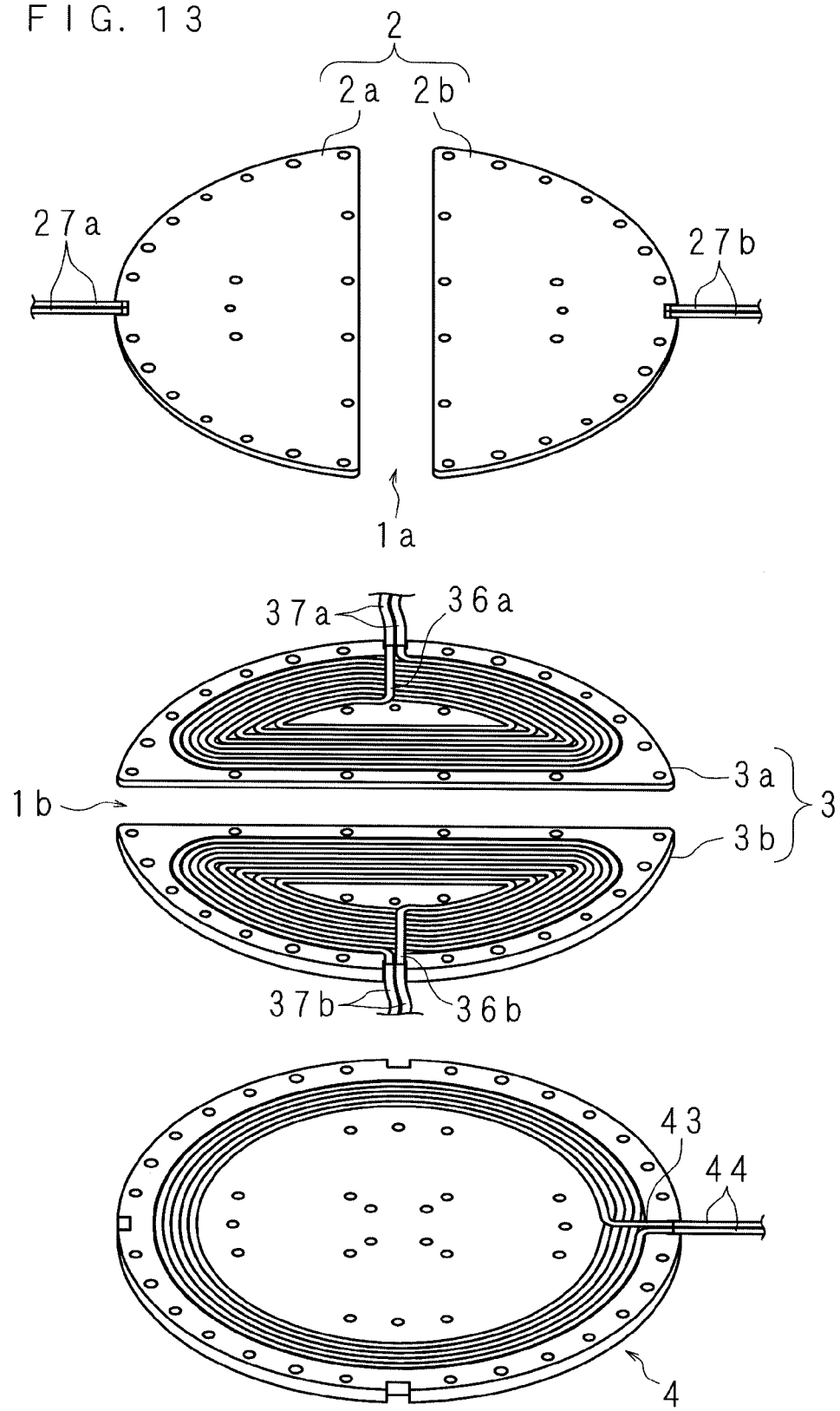
FIG. 13 is an exploded perspective view showing the structure of a gradient magnetic field coil according to Embodiment 2.

FIG. 13 is an exploded perspective view showing the structure of a gradient magnetic field coil according to Embodiment 2. As the order of stacking the X-coil 2, the Y-coil 3 and the Z-coil 4 in Embodiment 1, though the X-coil 2 is stacked on the Z-coil 4 and the Y-coil 3 is further stacked thereon, the X-coil 2 and the Y-coil 3 may be stacked in reverse order. In other words, it may be possible that the Y-coil 3 is stacked on the Z-coil 4 and the X-coil 2 is further stacked thereon.

The gradient magnetic field coil according to this embodiment includes the X-coil 2, the Y-coil 3 and the Z-coil 4. Since the configurations of the X-coil 2, the Y-coil 3 and the Z-coil 4 are similar to those according to Embodiment 1, they are designated by the same reference codes.

In this embodiment, the coils are stacked as described below. The Z-coil 4 is placed while the coil winding portion 42 is oriented upward. The lead wires 44 are placed at the three o'clock position. The Y-coil piece 3a and the Y-coil piece 3b are stacked thereon while the coil winding portions 33a and 33b are oriented upward respectively. In this case, the lead wires 37a of the Y-coil piece 3a are placed at the twelve o'clock position. The lead wires 37b of the Y-coil piece 3b are placed at the six o'clock position.

The crossover wire 43 of the Z-coil 4 is accommodated in the second clearance section 1b formed in the Y-coil 3.

Next, the X-coil 2 is stacked on the Y-coil 3. The straight part of the outer edge of the X-coil piece 2a is made orthogonal to that of the Y-coil piece 3a, and the straight part of the outer edge of the X-coil piece 2a is made orthogonal to that of the Y-coil piece 3b. Similarly, the straight part of the outer edge of the X-coil piece 2b is made orthogonal to that of the Y-coil piece 3a, and the straight part of the outer edge of the X-coil piece 2b is made orthogonal to that of the Y-coil piece 3b. Furthermore, the X-coil 2 is stacked while the coil winding portion 23a of the X-coil piece 2a and the coil winding portion 23b of the X-coil piece 2b are oriented downward. The reason for this is so that the crossover wire 26a of the X-coil piece 2a and the crossover wire 26b of the X-coil piece 2b are accommodated in the second clearance section 1b formed in the Y-coil 3.

The X-coil piece 2a and 2b are disposed so that the lead wires 27a of the X-coil piece 2a are placed at the nine o'clock position and so that the lead wires 27b of the X-coil piece 2b are placed at the three o'clock position. Just as in the case of the crossover wire 43 of the Z-coil 4, the crossover wire 26a of the X-coil piece 2a and the crossover wire 26b of the X-coil piece 2b are accommodated in the second clearance section 1b formed in the Y-coil 3. Furthermore, the lead wires 27b of the X-coil piece 2b are drawn out from the same position as that from which the lead wires 44 of the Z-coil 4 are drawn out.

The crossover wire 36a of the Y-coil piece 3a and the crossover wire 36b of the Y-coil piece 3b are accommodated in the first clearance section 1a formed in the X-coil 2.

Also in this embodiment, just as in the case of Embodiment 1, the thickness corresponding to three times the diameter of the crossover wire in total can be reduced in comparison with the gradient magnetic field coil of the prior art.

Embodiment 3

Figure 14:
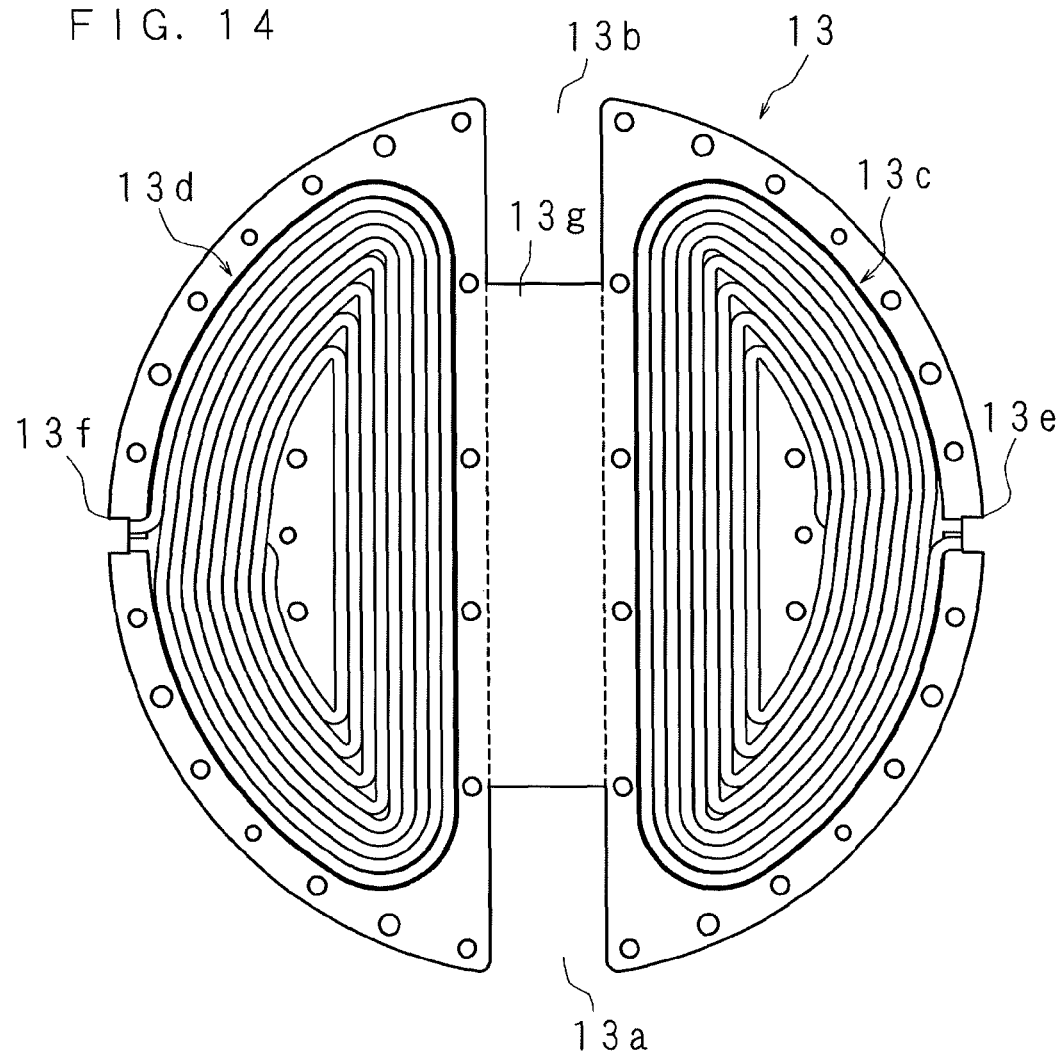
FIG. 14 is a plan view showing the shape of an X/Y coil bobbin according to Embodiment 3.

FIG. 14 is a plan view showing the shape of an X/Y coil bobbin according to Embodiment 3. Although the X-coil 2 and the Y-coil 3 are each configured using two bobbins in Embodiments 1 and 2 described above, the configuration is not limited to this. The X-coil 2 or the Y-coil 3 may be configured using a single bobbin. In the case that a single bobbin is used, a clearance section is provided and this clearance section is used to serve as the first clearance section 1a and the second clearance section 1b.

Since an X/Y coil bobbin 13 (hereafter referred to as "bobbin 13") according to Embodiment 3 is different in that two bobbins are integrated into a single bobbin but is similar in other configurational respects, only the differences will mainly be described below.

First, a case in which the X-coil 2 is formed will be described.

The bobbin 13 includes clearance sections 13a and 13b, grooves 13c and 13d, notches 13e and 13f, and a connection section 13g.

The bobbin 13 has a shape obtained by cutting out, from its outer edge, parts of a disc having a radius substantially equal to that of the above-mentioned Z-coil bobbin 41. The clearance sections 13a and 13b formed by the cutting out are provided at two places. The clearance sections 13a and 13b are placed symmetrically with respect to the center of the disc. The clearance sections 13a and 13b serve as the above-mentioned first clearance section 1a.

The shape of the clearance sections 13a and 13b is substantially rectangular in a plan view. The rectangular section in a plan view obtained after the cutting out is the connection section 13g. The rectangular connection section 13g is formed so as to be symmetric with respect to the direction intersecting with the notching direction of the notches 13e and 13f from the central portion of the bobbin 13. The longitudinal length of the connection section 13g is shorter than the diameter of the bobbin 13.

The grooves 13c and 13d are grooves in which the coil wires are embedded and are formed symmetrically with the connection section 13g provided therebetween. The shape of each of the grooves 13c and 13d is similar to that of the above-mentioned X-coil bobbin 21, for example.

The notches 13e and 13f are provided so that the lead wires are drawn out therefrom. Just as in the case of the X-coil bobbin according to Embodiment 1, the notches 13e and 13f are formed so that their positions are aligned with the circumferential positions of the winding start and end of the coil winding formed by the grooves 13c and 13d.

The clearance sections 13a and 13b are provided at positions where the notches 13e and 13f are rotated by 90 degrees centering around the bobbin 13. In other words, in the case that the notches 13e and 13f are placed at the three o'clock position and the nine o'clock position, respectively, the clearance sections 13a and 13b are placed at the six o'clock position and the twelve o'clock position, respectively.

In the case that the X-coil 2 is configured using the bobbin 13, a coil wire made of a conductor, such as a copper wire, is embedded in each of the grooves 13c and 13d to form a coil winding portion. The formed coil piece is the X-coil piece 2a or the X-coil piece 2b. The lead wires of the X-coil piece 2a or the X-coil piece 2b are drawn out from the notch 13f or the notch 13e. The two X-coil piece 2a and 2b are connected via the connection section 13g.

Similarly, the Y-coil 3 can be configured using the bobbin 13. In other words, the coils formed using the grooves 13c and 13d are the Y-coil piece 3a and the Y-coil piece 3b, respectively. In this case, the connection section 13g serves as a second connection section. Furthermore, the clearance sections 13a and 13b serve as the above-mentioned second clearance section 1b.

Since this embodiment is different from Embodiment 1 only in the shape of the bobbin and is similar to Embodiment 1 in other respects, which will not be described in detail.

The shapes of the clearance sections 13a and 13b and the connection section 13g described above are merely examples. The clearance sections 13a and 13b and the connection section 13g may have other shapes, provided that a proper distance is maintained between the coil pieces and that clearances capable of sufficiently accommodating the crossover wires are obtained.

For example, the longitudinal length of the connection section shown in FIG. 14 may be shortened. The shape of the connection section is not limited to the rectangular shape in a plan view, but the sides thereof for forming the clearance sections may be curved. Furthermore, the connection section may be formed of a plurality of thin plates so as to bridge the coil pieces, instead of forming the connection section 1 using a single plate. In addition, any shape capable of properly maintaining the distance between the two coil pieces and obtaining a sufficient clearance section for accommodating the crossover wires can be adopted as the connection section.

Embodiment 4

Although the lead wires of the gradient magnetic field coil are drawn out from the four places in Embodiment 1 described above, one wire drawing place is provided in the present embodiment by additionally using a new bobbin.

Figure 15:
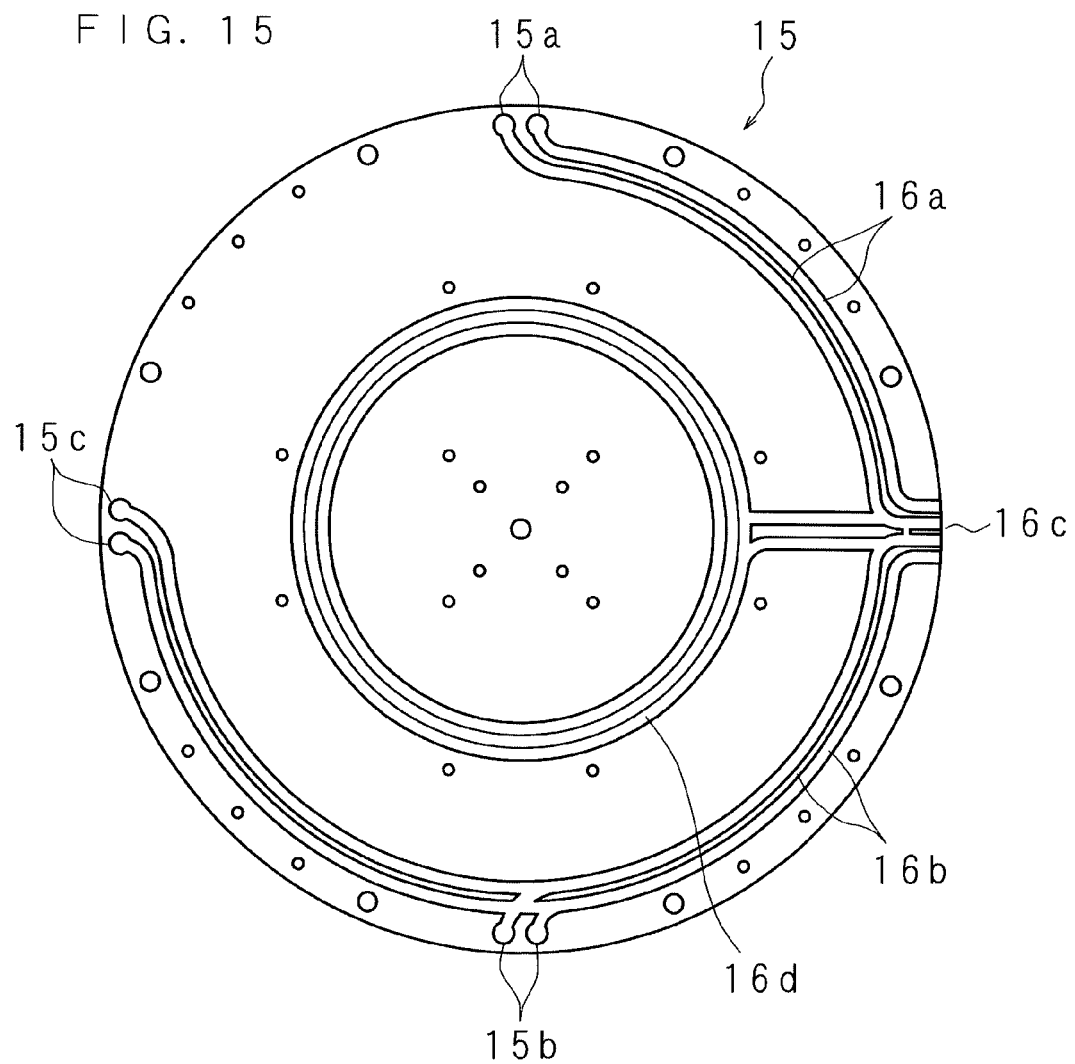
FIG. 15 is a plan view showing the shape of a Z2 bobbin according to Embodiment 4.

FIG. 15 is a plan view showing the shape of a Z2 bobbin according to Embodiment 4.

The Z2 bobbin 15 (hereafter referred to as "bobbin 15") has a disc shape. The radius of curvature of the Z2 bobbin 15 is substantially equal to the radius of curvature of the Z-coil bobbin 41. The Z2 bobbin 15 includes holes 15a, 15b and 15c for allowing the lead wires to pass through and grooves 16a, 16b and 16c for guiding the lead wires.

The holes 15a, 15b and 15c respectively have two holes. The holes 15a, 15b and 15c are provided along the outer edge of the bobbin 15, and the grooves 16c are formed in a direction from the outer edge of the bobbin 15 to the inside and connected to the grooves 16a and 16b. In the case that the grooves 16c are placed at the three o'clock position, the holes 15a are placed close to the twelve o'clock position, the holes 15b are placed close to the six o'clock position, and the holes 15c are placed close to the nine o'clock position.

The grooves 16a are grooves for guiding the lead wires drawn out from the holes 15a to the grooves 16c, and the grooves 16b are grooves for guiding the lead wires drawn out from the holes 15b and 15c to the grooves 16c. The grooves 16a and the grooves 16b are formed of two grooves for guiding a pair of lead wires. The grooves 16a and 16b are formed at positions inside the inner circumference of the bobbin 15 away from the outer edge of the bobbin 15 by a predetermined distance in the radial direction along the outer edge of the bobbin 15.

Screw holes for allowing screws to pass through when the bobbin 15 is connected to other bobbins are provided as necessary between the outer edge of the bobbin 15 and the grooves 16a and 16b.

In addition, an annular groove portion 16d is formed at the central portion of the bobbin 15.

Figure 16:
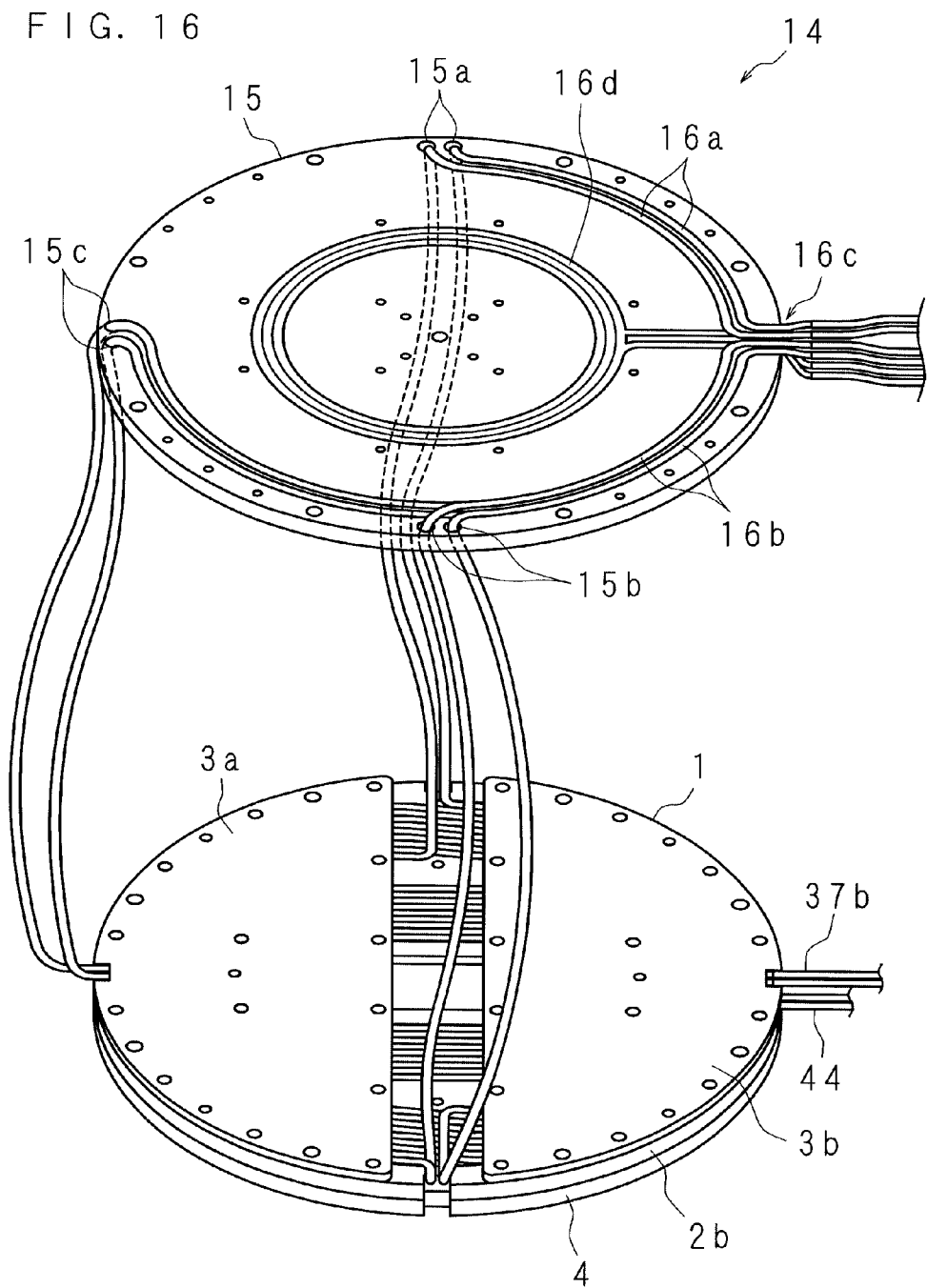
FIG. 16 is an exploded perspective view showing the structure of a gradient magnetic field coil according to Embodiment 4.

FIG. 16 is an exploded perspective view showing the structure of a gradient magnetic field coil according to Embodiment 4. The gradient magnetic field coil 14 according to Embodiment 4 is formed by stacking the Z2 bobbin 15 on the gradient magnetic field coil 1 according to Embodiment 1, that is, on the Y-coil 3.

The Z2 bobbin 15 is a bobbin on which a Z2 coil (not shown) is disposed. The Z2 coil is disposed in the annular groove portion 16d formed at the central portion of the bobbin 15. The Z2 coil is a coil for improving the uniformity of the magnetic field.

The bobbin 15 and the gradient magnetic field coil 1 are positioned as described below and then stacked. The stacking is performed so that the positions of the lead wires 44 of the Z-coil 4 and the lead wires 37b of the Y-coil piece 3b of the gradient magnetic field coil 1 are aligned with the position of the grooves 16c of the bobbin 15.

In the case of this stacking, the lead wires 27a of the X-coil piece 2a pass through the holes 15a and are drawn out from the gradient magnetic field coil 1 to the upper face of the bobbin 15. Similarly, the lead wires 27b of the X-coil piece 2b pass through the holes 15b and the lead wires 37a of the Y-coil piece 3a pass through the holes 15c and are drawn out from the gradient magnetic field coil 1 to the upper face of the bobbin 15.

After the drawing out, the lead wires 27a of the X-coil piece 2a are guided by the grooves 16a, the lead wires 27b of the X-coil piece 2b and the lead wires 37a of the Y-coil piece 3a are guided by the grooves 16b, respectively, and the lead wires are routed to the grooves 16c.

The lead wires 44 of the Z-coil 4 and the lead wires 37b of the Y-coil piece 3b are drawn out from under the Z2 bobbin 15 to the outside of the gradient magnetic field coil 14.

All the lead wires 27a, 27b and 37a routed to the grooves 16c are drawn out from the grooves 16c to the outside of the gradient magnetic field coil 14.

The number of the lead wire drawing-out places in the gradient magnetic field coil 1 according to Embodiment 1 is decreased from four to one in this embodiment as described above by adding the new bobbin 15 to the gradient magnetic field coil 1.

Hence, the lead wires are easily routed when the gradient magnetic field coil 14 is installed in an MRI apparatus, whereby an effect of reducing the man-hours for assembling the MRI apparatus is obtained.

Although the case in which the Z2 bobbin 15 is added to the gradient magnetic field coil 1 according to Embodiment 1 is described in this embodiment, a similar effect can be obtained by adding the Z2 bobbin 15 to the gradient magnetic field coils according to Embodiments 2 and 3 in a similar way.

Embodiment 5

Next, a cooling mechanism for use in the case that the gradient magnetic field coil 14 according to Embodiment 4 is used in an MRI apparatus will be described. The gradient magnetic field coil is heated significantly because pulse current is supplied repeatedly during imaging. Since the heat generated from the gradient magnetic field coil may affect the quality of the image to be taken or may inflict pain to the subject to be imaged, a mechanism for cooling the gradient magnetic field coil is necessary.

Figure 17:
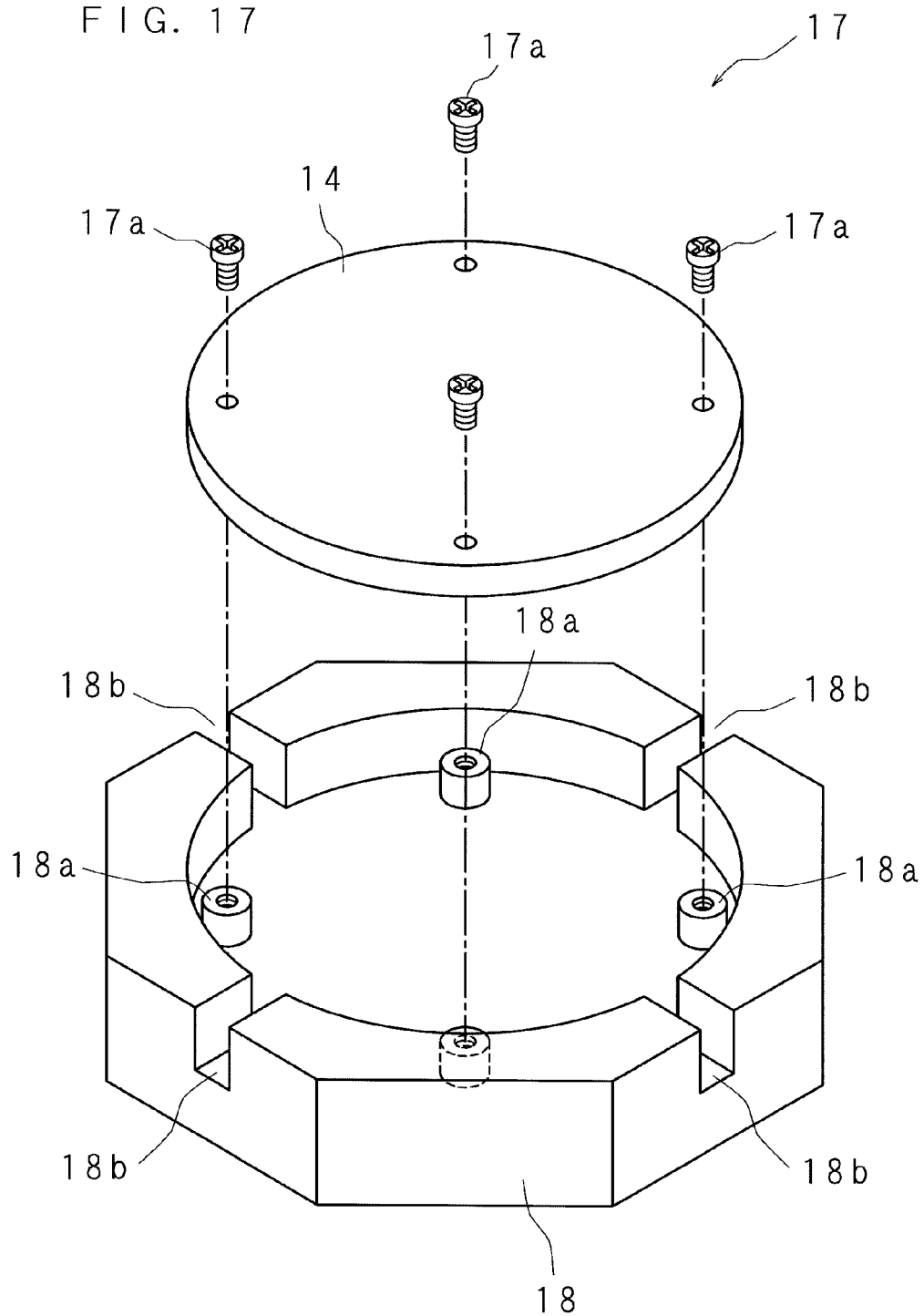
FIG. 17 is an exploded perspective view showing the structure of a gradient magnetic field coil unit according to Embodiment 5.

FIG. 17 is an exploded perspective view showing the structure of a gradient magnetic field coil unit according to Embodiment 5. A gradient magnetic field coil unit 17 is configured such that the gradient magnetic field coil 14 is secured to a pole piece 18 using four mounting screws 17a. Since the bottom face of the gradient magnetic field coil unit 17 is installed in an MRI apparatus, the upper face of the gradient magnetic field coil unit 17 shown in FIG. 17, that is, the face on which the gradient magnetic field coil 14 is installed, is opposed to the subject.

The pole piece 18 has an octagonal pillar shape, and a cylindrical hollow portion for accommodating the gradient magnetic field coil 14 is formed inside the pole piece 18. In the hollow portion, fixing bosses 18a having a female screw are formed at four places along the outer edge of the hollow portion to secure the gradient magnetic field coil 14 to the pole piece 18 using screws. The fixing bosses 18a are provided at equal intervals in the circumferential direction.

The gradient magnetic field coil 14 is secured to the pole piece 18 using screws 17a passing through the screw holes provided along the outer edge thereof and the fixing bosses 18a. The fixing bosses 18a are formed so that the upper face of the gradient magnetic field coil 14 is flush with the upper face of the pole piece 18 when the gradient magnetic field coil 14 is installed in the pole piece 18. In other words, the fixing bosses 18a are formed so that the upper faces thereof are lower than the upper face of the pole piece 18 by the thickness of the gradient magnetic field coil 14.

Four lead wire grooves 18b for allowing the lead wires of the gradient magnetic field coil 14 to be drawn out are provided in the pole piece 18. The lead wire grooves 18b are provided at equal intervals in the circumferential direction so as not to overlap with the fixing bosses 18a.

Figure 18:
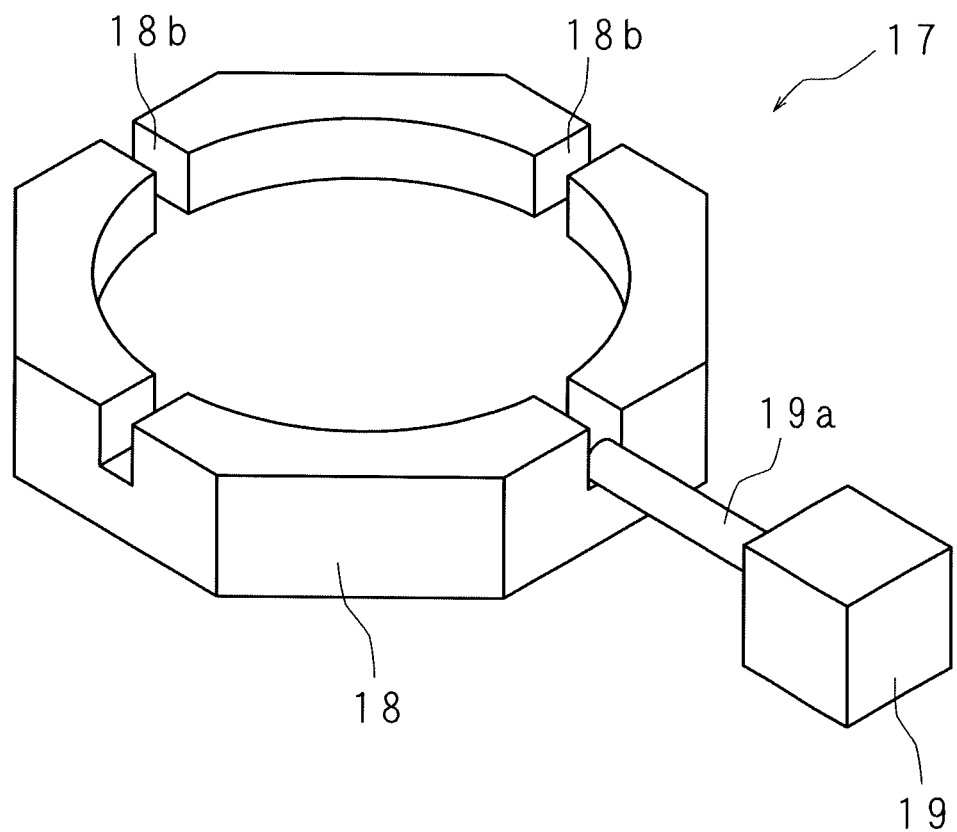
FIG. 18 is a schematic view showing a gradient magnetic field coil cooling mechanism according to Embodiment 5.

FIG. 18 is a schematic view showing a gradient magnetic field coil cooling mechanism according to Embodiment 5. An air hose 19a for supplying air from an air pump 19 is connected to one of the lead wire grooves 18b provided in the gradient magnetic field coil unit 17. The air fed from the air pump 19 is discharged from the other three lead wire grooves 18b. The gradient magnetic field coil 14 is cooled by this flow of air. One of the lead wire grooves 18b is used to allow the lead wires of the gradient magnetic field coil 14 to be drawn out therefrom.

Since the drawing out position of the lead wires of the gradient magnetic field coil 14 is provided at one place in this embodiment, the gradient magnetic field coil 14 can be cooled efficiently using the above-mentioned mechanism.

Embodiment 6

In this embodiment, a case in which the flat coil according to the present invention is applied to the gradient magnetic field coil of an electron spin resonance apparatus (hereafter referred to as "ESR apparatus") will be described.

The ESR apparatus is a kind of magnetic resonance apparatus for irradiating a measurement sample placed in a static magnetic field with a microwave and for recording how the radiated microwave is absorbed by the measurement sample. If a free-radical is present in the measurement sample, the microwave is absorbed as the static magnetic field is swept, and an absorption spectrum reflecting the molecular structure of the free-radical is recorded on a recorder. Information regarding the molecular structure of the free-radical can be obtained by analyzing this absorption spectrum.

Figure 19:
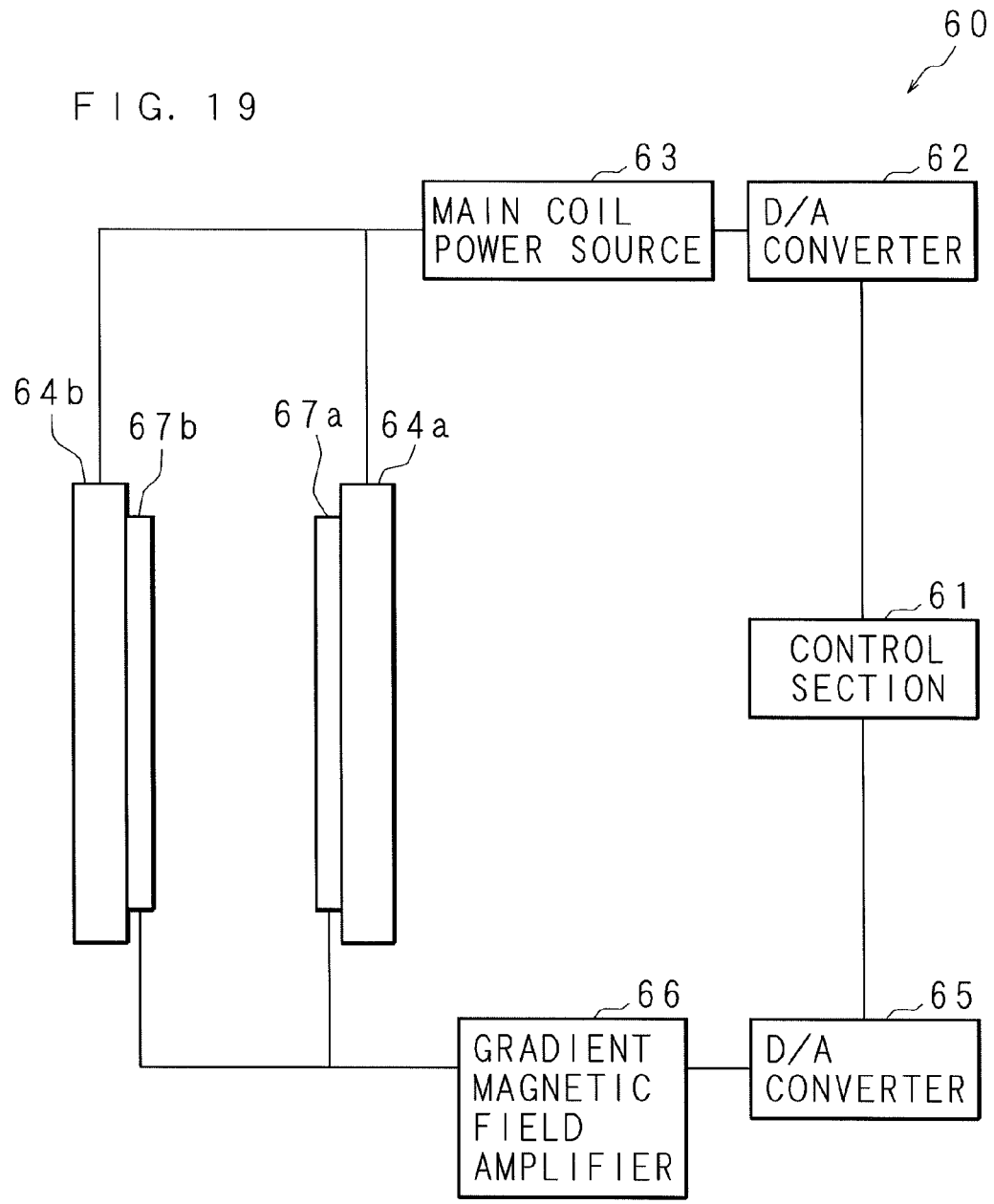
FIG. 19 is an explanatory view showing the configuration of the magnetic field generation section of an ESR apparatus according to Embodiment 6.

FIG. 19 is an explanatory view showing the configuration of the magnetic field generation section 60 of an ESR apparatus according to Embodiment 6.

In FIG. 19, main coils 64a and 64b generate a uniform static magnetic field obtained depending on the frequency and the resonance conditions of a microwave. The gradient magnetic field coils 67a and 67b each have X, Y and Z-axis coils, and each coil generates a gradient magnetic field having high linearity along each coordinate axis.

The generated static magnetic field and gradient magnetic fields are applied to a cavity resonator accommodating the measurement sample placed in the space between the gradient magnetic field coils 67a and 67b.

The reason for generating the gradient magnetic fields is to obtain spatial positional information.

Next, a coil excitation method will be described. The digital control signal from a control section 61 is converted into an analog signal by a main coil D/A converter 62 and then input to a main coil power source 63. The main coil power source 63 outputs predetermined DC current and the main coils 64a and 64b generate a predetermined static magnetic field.

Furthermore, a digital control signal from the control section 61 is converted into an analog signal by a gradient magnetic field coil D/A converter 65, and the converted analog signal is input to a gradient magnetic field amplifier 66 and amplified. The gradient magnetic field amplifier 66 outputs DC current having a predetermined waveform, and the gradient magnetic field coils 67a and 67b generate a superimposed magnetic field.

In the magnetic field generation section 60 of the ESR apparatus according to this embodiment, the gradient magnetic field coil 1 according to the present invention is adopted as the gradient magnetic field coils 67a and 67b. The gradient magnetic field coil 1 according to the present invention is thinner than the gradient magnetic field coil according to the prior art. Hence, the distance between the main coils 64a and 64b and the cavity resonator in which the measurement sample is accommodated can be reduced without reducing the distance between the gradient magnetic field coils 67a and 67b. As a result, an effect of intensifying the magnetic field in the static magnetic space is obtained.

It is construed that the above-mentioned embodiments are examples in all respects and do not limit the concept of the present invention. The scope of the present invention is defined not by the above descriptions but by the appended claims, and the present invention is intended to include all modifications within the meaning and the range of equivalency of the claims.

The invention claimed is:

1. A coil device comprising:
   a flat plate-shaped first coil which has a first clearance section; and
   a flat plate-shaped second coil whose part or whole of a lead wire drawn out from the inside to the peripheral portion of the second coil while striding over the second coil is accommodated in the first clearance section.

2. The coil device according to claim 1, wherein
   the first coil has two coil pieces which are disposed, side by side, with the clearance section being interposed between the coil pieces.

3. The coil device according to claim 2, wherein
   the first coil has a connection section for connecting own two coil pieces.

4. The coil device according to claim 3, further comprising:
   a third coil having a flat plate shape is further provided, wherein
   the second coil, the first coil and the third coil are stacked in this order,
   the third coil has a second clearance section,
   part or whole of a lead wire drawn out from the inside to the peripheral portion of the first coil while striding over the first coil is accommodated in the second clearance section, and
   part or whole of a lead wire drawn out from the inside to the peripheral portion of the third coil while striding over the third coil is accommodated in the first clearance section.

5. The coil device according to claim 4, wherein
the third coil has two coil pieces which are disposed, side by side, with the second clearance section being interposed between the coil pieces.

6. The coil device according to claim 5, wherein
the third coil has a connection section for connecting own two coil pieces.

7. The coil device according to claim 1, further comprising:
a third coil having a flat plate shape is further provided, wherein
the second coil, the first coil and the third coil are stacked in this order,
the third coil has a second clearance section,
part or whole of a lead wire drawn out from the inside to the peripheral portion of the first coil while striding over the first coil is accommodated in the second clearance section, and
part or whole of a lead wire drawn out from the inside to the peripheral portion of the third coil while striding over the third coil is accommodated in the first clearance section.

8. The coil device according to claim 7, wherein
the third coil has two coil pieces which are disposed, side by side, with the second clearance section being interposed between the coil pieces.

9. The coil device according to claim 8, wherein
the third coil has a connection section for connecting own two coil pieces.

10. A magnetic resonance imaging apparatus comprising:
the coil device according to claim 7 as a gradient magnetic field coil.

11. The coil device according to claim 2, further comprising:
a third coil having a flat plate shape is further provided, wherein
the second coil, the first coil and the third coil are stacked in this order,
the third coil has a second clearance section,
part or whole of a lead wire drawn out from the inside to the peripheral portion of the first coil while striding over the first coil is accommodated in the second clearance section, and
part or whole of a lead wire drawn out from the inside to the peripheral portion of the third coil while striding over the third coil is accommodated in the first clearance section.

12. The coil device according to claim 11, wherein
the third coil has two coil pieces which are disposed, side by side, with the second clearance section being interposed between the coil pieces.

13. The coil device according to claim 12, wherein
the third coil has a connection section for connecting own two coil pieces.

14. The coil device according to claim 2, wherein the two coil pieces of the first coil each have an arc shape.

15. The coil device according to claim 14, further comprising a flat plate-shaped third coil which has a second clearance section, wherein the third coil has two coil pieces which are disposed, side by side, with the second clearance section being interposed between the coil pieces.

16. The coil device according to claim 15, wherein the two coil pieces of the third coil each have an arc shape.

17. The coil device according to claim 15, wherein the first clearance section and the second clearance section are orthogonal to each other.

* * * * *